US012597462B2

(12) United States Patent
Li et al.

(10) Patent No.: US 12,597,462 B2
(45) Date of Patent: Apr. 7, 2026

(54) NON-VOLATILE MEMORY WITH HYBRID ROUTING FOR SHARED WORD LINE SWITCHES

(71) Applicant: Sandisk Technologies, Inc., Milpitas, CA (US)

(72) Inventors: Guangyuan Li, Santa Clara, CA (US); Junsong Xing, San Jose, CA (US); Fumiaki Toyama, Cupertino, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 197 days.

(21) Appl. No.: 18/443,663

(22) Filed: Feb. 16, 2024

(65) Prior Publication Data

US 2025/0266084 A1    Aug. 21, 2025

(51) Int. Cl.
| | |
|---|---|
| *G11C 5/06* | (2006.01) |
| *G11C 11/4074* | (2006.01) |
| *G11C 11/408* | (2006.01) |
| *G11C 11/4096* | (2006.01) |

(52) U.S. Cl.
CPC .......... *G11C 11/4096* (2013.01); *G11C 5/063* (2013.01); *G11C 11/4074* (2013.01); *G11C 11/4085* (2013.01)

(58) Field of Classification Search
CPC . G11C 11/4096; G11C 5/063; G11C 11/4074; G11C 11/4085; G11C 11/5628; G11C 16/0483; G11C 5/025; G11C 8/14; G11C 16/08

USPC .................................................... 365/189.011
See application file for complete search history.

(56) References Cited

U.S. PATENT DOCUMENTS

| | | | |
|---|---|---|---|
| 11,817,150 B2 | 11/2023 | Shao et al. | |
| 2006/0268653 A1* | 11/2006 | Umezawa | .............. H10B 41/49 257/E21.691 |
| 2021/0375901 A1 | 12/2021 | Oh et al. | |
| 2023/0207504 A1 | 6/2023 | Shao et al. | |
| 2023/0268001 A1 | 8/2023 | Shao et al. | |

* cited by examiner

*Primary Examiner* — Huan Hoang
(74) *Attorney, Agent, or Firm* — PEARL COHEN ZEDEK LATZER BARATZ LLP

(57) ABSTRACT

Word line switches are used to connect word lines to sources of voltage to perform memory operations. To save room in a non-volatile memory, it is proposed to share word line switches between neighboring memory arrays. To implement shared word line switches, two types of routing will be used: high metal routing for some shared word line switches and low metal routing for other shared word line switches. For the high metal routing, lateral routing is implemented in high metal layers to enable a word line switch to connect to two neighboring memory arrays. For the low metal routing, lateral routing is implemented in low metal layers to enable a word line switch to connect to two neighboring memory arrays. The high metal layers are positioned below the memory arrays and above the low metal layers. The low metal layers are positioned above the word line switches.

20 Claims, 23 Drawing Sheets

| Block M-1 | Block M-1 |
| :---: | :---: |
| ■<br>■<br>■ | ■<br>■<br>■ |

406

| Block 2 | Block 2 |
| :---: | :---: |
| Block 1 | Block 1 |
| Block 0 | Block 0 |

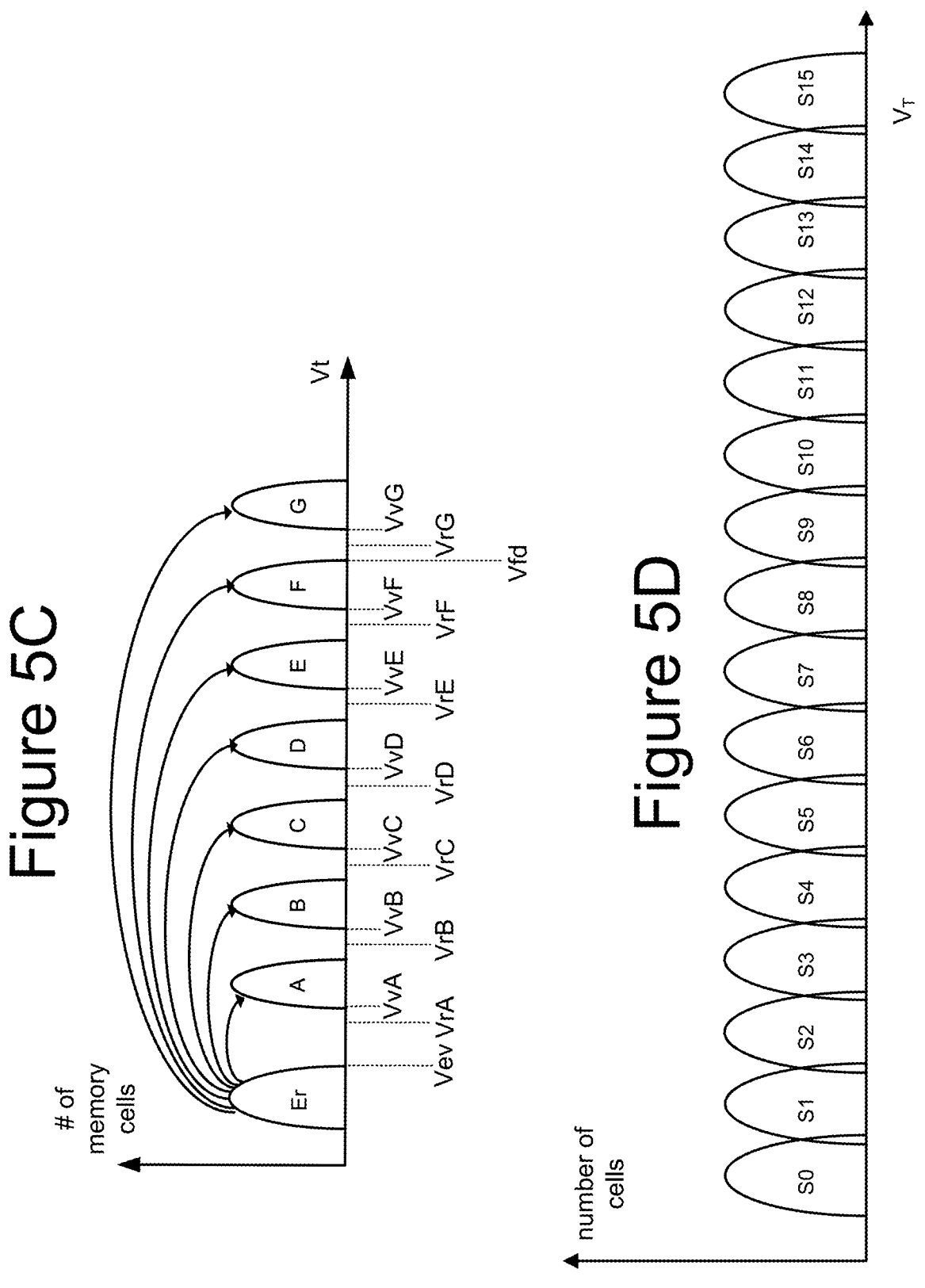

850

1102

1112

D0

1106

1116

1104

1114

1120

1120

MO

1120

Center

1124

1124

1120 1120

1120

1122

1124

1122

1124

1122

M1

1122

1124

1120

1122

1122

1120 1120

1120

1120

1120

1124

1122

1124

850

1124

1122

1122

1122

1124

1124

1122

1134

1134

1130

1130 1130 1130

1130

1134

1130

MO

1130

1134

1134

1132

1132

CC

1132

1132

1132

1134

1132

1132

1134

1134

1132

1134

1132

1134

1134

1130 1130 1130 1130 1130 1130

850

Figure 12D
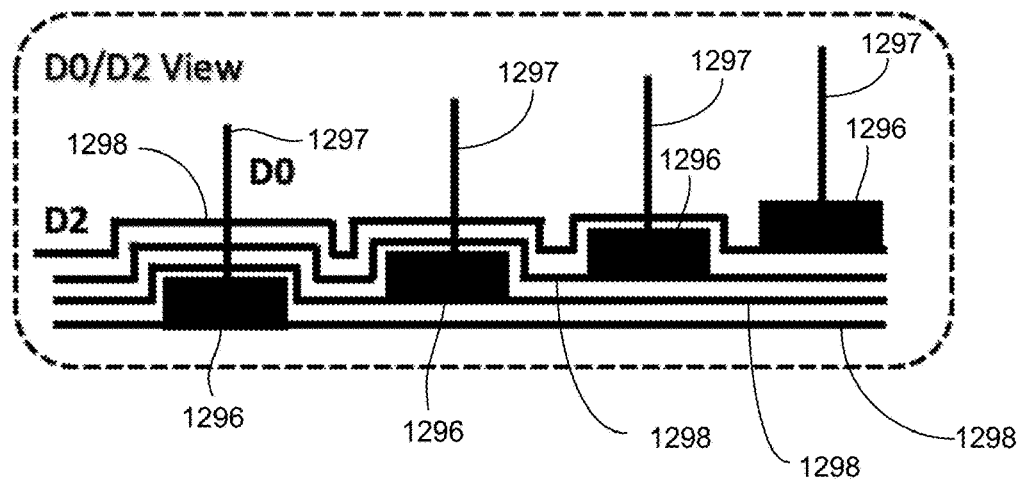
Figure 12E
Figure 12F
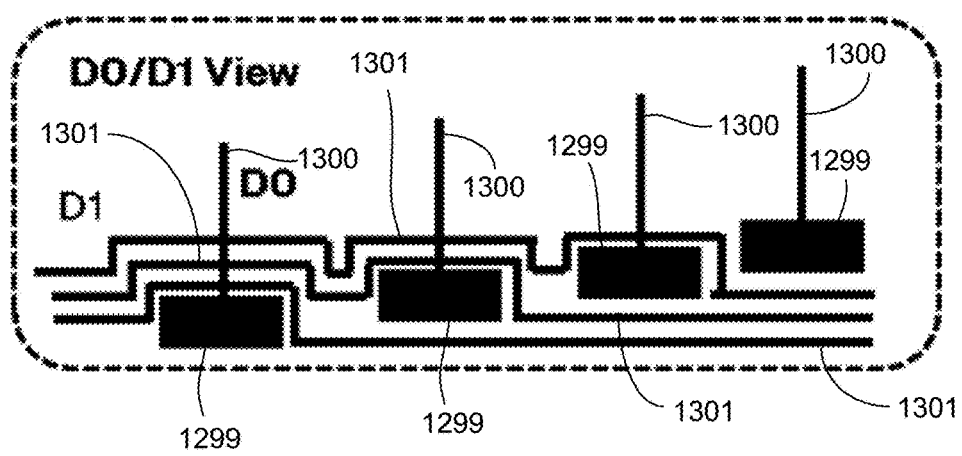

Figure 13

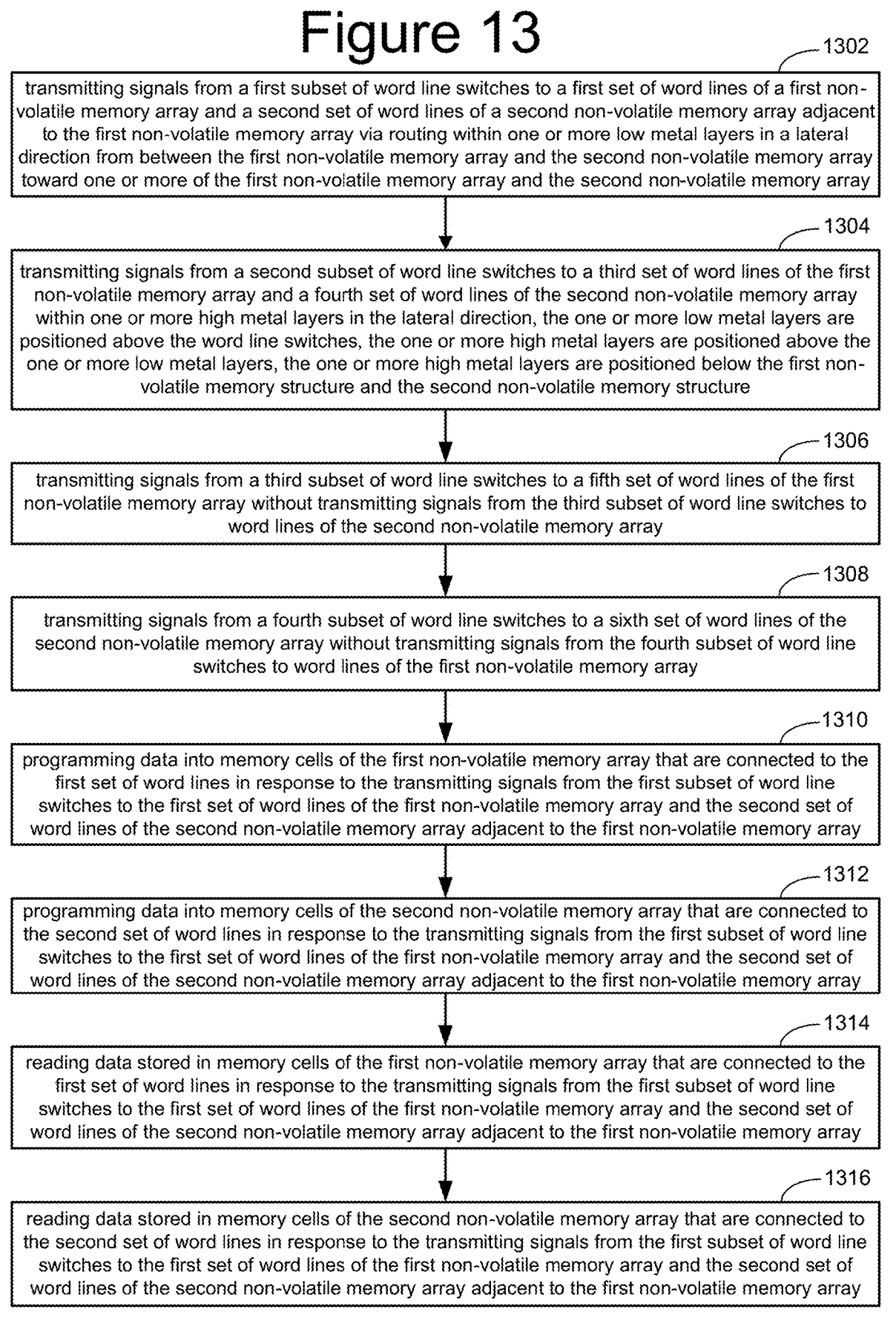

1302 transmitting signals from a first subset of word line switches to a first set of word lines of a first non-volatile memory array and a second set of word lines of a second non-volatile memory array adjacent to the first non-volatile memory array via routing within one or more low metal layers in a lateral direction from between the first non-volatile memory array and the second non-volatile memory array toward one or more of the first non-volatile memory array and the second non-volatile memory array

1304 transmitting signals from a second subset of word line switches to a third set of word lines of the first non-volatile memory array and a fourth set of word lines of the second non-volatile memory array within one or more high metal layers in the lateral direction, the one or more low metal layers are positioned above the word line switches, the one or more high metal layers are positioned above the one or more low metal layers, the one or more high metal layers are positioned below the first non-volatile memory structure and the second non-volatile memory structure

1306 transmitting signals from a third subset of word line switches to a fifth set of word lines of the first non-volatile memory array without transmitting signals from the third subset of word line switches to word lines of the second non-volatile memory array

1308 transmitting signals from a fourth subset of word line switches to a sixth set of word lines of the second non-volatile memory array without transmitting signals from the fourth subset of word line switches to word lines of the first non-volatile memory array

1310 programming data into memory cells of the first non-volatile memory array that are connected to the first set of word lines in response to the transmitting signals from the first subset of word line switches to the first set of word lines of the first non-volatile memory array and the second set of word lines of the second non-volatile memory array adjacent to the first non-volatile memory array

1312 programming data into memory cells of the second non-volatile memory array that are connected to the second set of word lines in response to the transmitting signals from the first subset of word line switches to the first set of word lines of the first non-volatile memory array and the second set of word lines of the second non-volatile memory array adjacent to the first non-volatile memory array

1314 reading data stored in memory cells of the first non-volatile memory array that are connected to the first set of word lines in response to the transmitting signals from the first subset of word line switches to the first set of word lines of the first non-volatile memory array and the second set of word lines of the second non-volatile memory array adjacent to the first non-volatile memory array

1316 reading data stored in memory cells of the second non-volatile memory array that are connected to the second set of word lines in response to the transmitting signals from the first subset of word line switches to the first set of word lines of the first non-volatile memory array and the second set of word lines of the second non-volatile memory array adjacent to the first non-volatile memory array

NON-VOLATILE MEMORY WITH HYBRID ROUTING FOR SHARED WORD LINE SWITCHES

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory.

Users of non-volatile memory desire ever larger storage capacity in order to store more data. As the storage capacity of memory systems grow, the physical size of the memories can increase. However, there is a need to maintain small sizes for memory systems so that they do not require an increase in size of the host device that houses the memory. For example, a memory system for a mobile telephone needs to be small to accommodate the small form factor of the mobile telephone.

BRIEF DESCRIPTION OF THE DRAWINGS

Like-numbered elements refer to common components in the different figures.

FIG. 4A is a block diagram of one embodiment of a memory structure having two planes.

FIG. 5C depicts threshold voltage distributions.

FIG. 5D depicts threshold voltage distributions.

FIGS. 12A-F depict routing schemes in a plurality of metal layers for routing electrical signals.

FIG. 13 is a flow chart describing one embodiment of a process for operating non-volatile memory.

DETAILED DESCRIPTION

Word line switches are used to connect word lines to sources of voltage in order to perform memory operations. To save room in a non-volatile memory (so that the memory can be smaller in size), it is proposed to share word line switches between neighboring non-volatile memory arrays. To implement shared word line switches, two types of routing will be used: high metal routing for some of the shared word line switches and low metal routing for some of the shared word line switches. For the high metal routing, lateral routing is implemented in high metal layers to enable a word line switch to connect to two neighboring non-volatile memory arrays. For the low metal routing, lateral routing is implemented in low metal layers to enable a word line switch to connect to two neighboring non-volatile memory arrays. The high metal layers are positioned below the memory arrays and above the low metal layers. The low metal layers are positioned above the word line switches.

Figure 1:
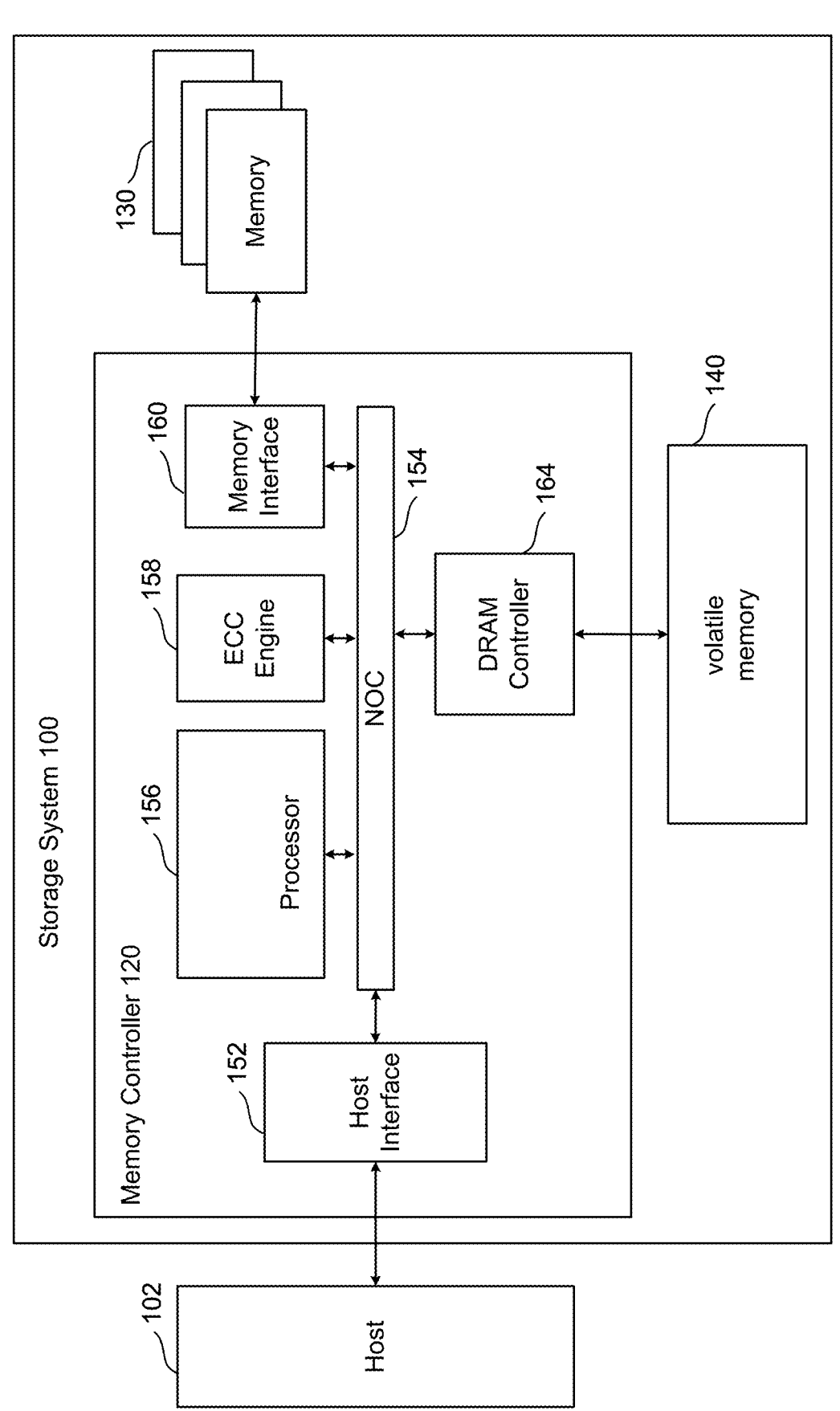
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
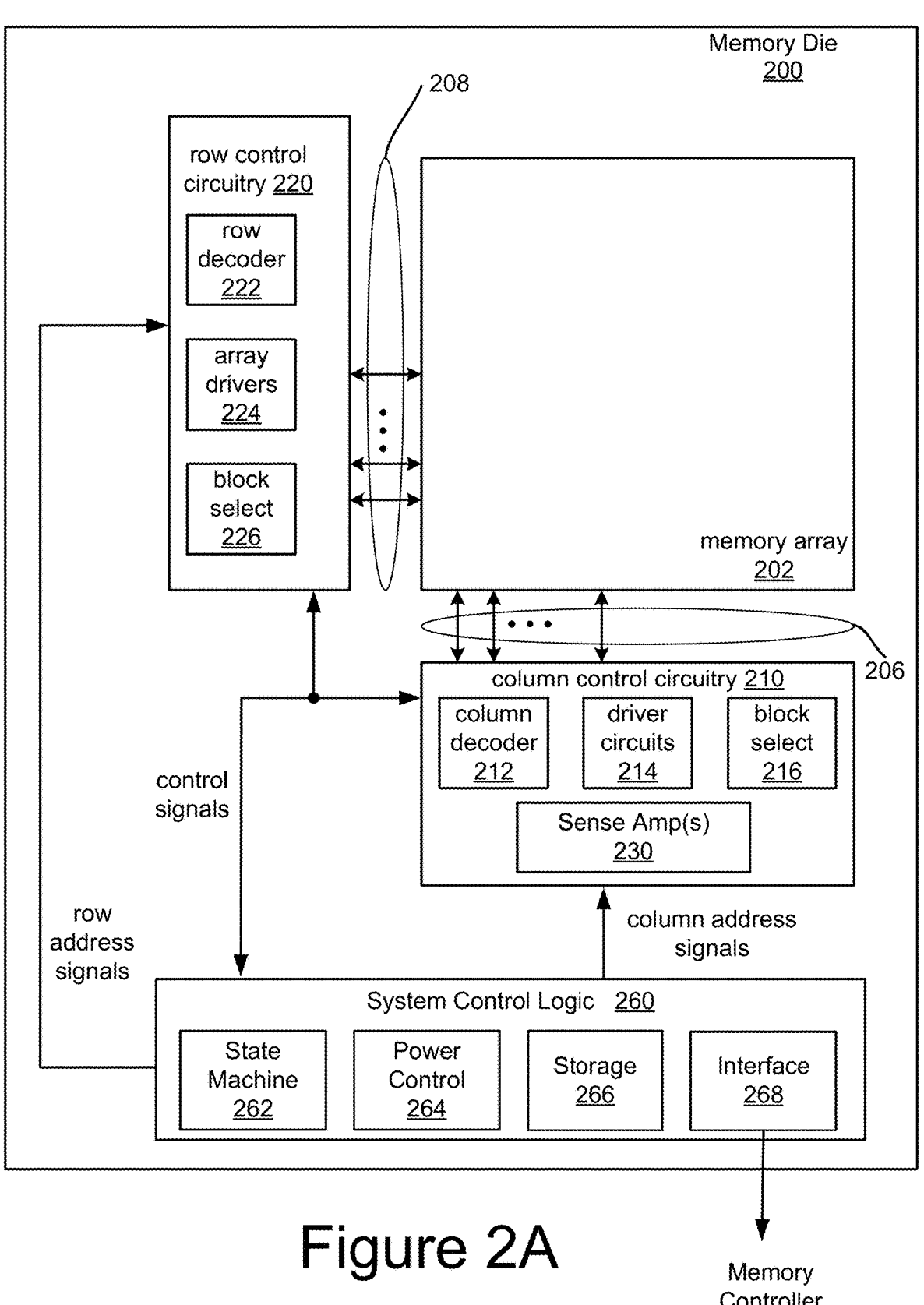
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations and may include charge pumps and regulator circuit for creating regulating voltages. System control logic 260 includes storage 266 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that is mono- lithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memo- ries), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimen- sional arrays, vertical bit line arrays, and the like.

One example of a ReRAM cross-point memory includes reversible resistance-switching elements arranged in cross- point arrays accessed by X lines and Y lines (e.g., word lines and bit lines). In another embodiment, the memory cells may include conductive bridge memory elements. A conductive bridge memory element may also be referred to as a pro- grammable metallization cell. A conductive bridge memory element may be used as a state change element based on the physical relocation of ions within a solid electrolyte. In some cases, a conductive bridge memory element may include two solid metal electrodes, one relatively inert (e.g., tung- sten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's mag- netization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behav- ior of chalcogenide glass. One embodiment uses a GeTe—

Sb2Te3 super lattice to achieve non-thermal phase changes by simply changing the co-ordination state of the Germa- nium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insulator substrate.

A person of ordinary skill in the art will recognize that the technology described herein is not limited to a single spe- cific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral cir- cuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing opera- tions for manufacturing a CMOS die will differ in many aspects from the processing operations optimized for an NMOS flash NAND memory or other memory cell tech- nologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decod- ers and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
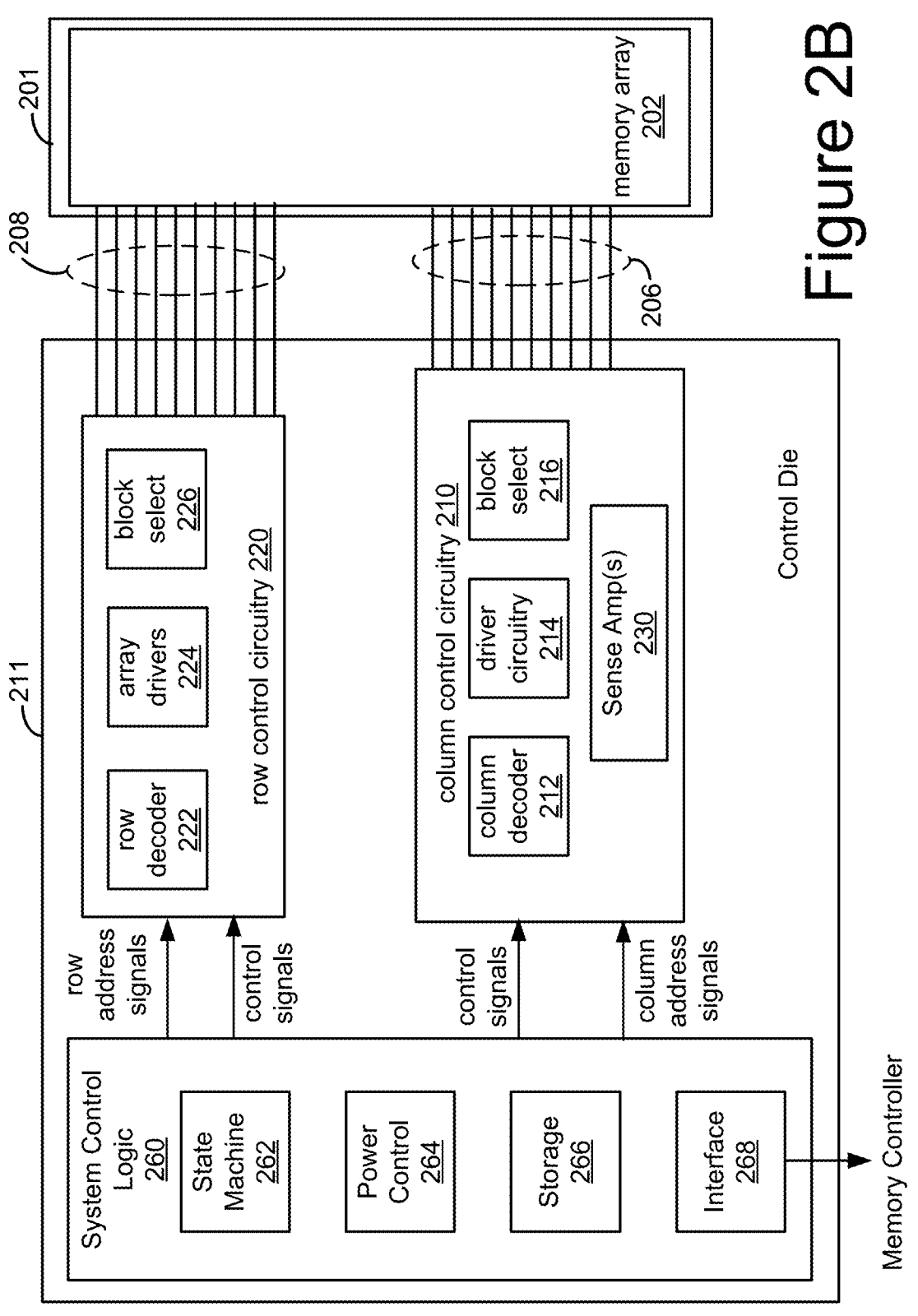
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
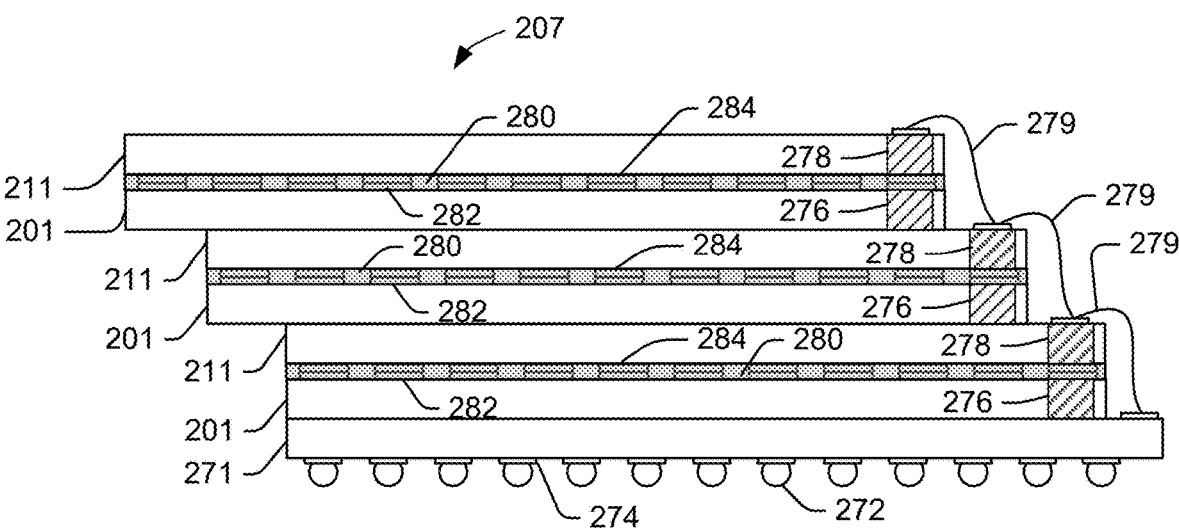
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 279 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
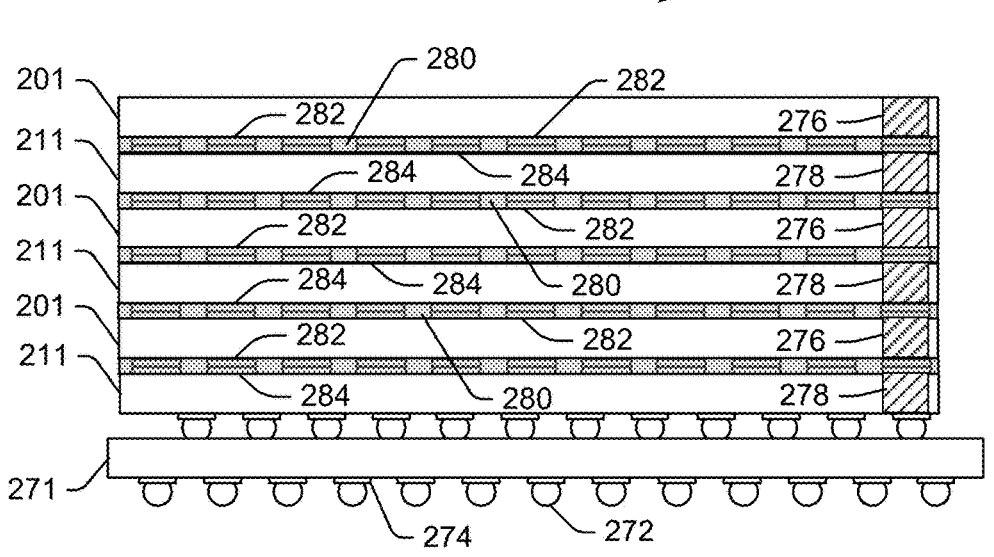

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller (or greater) sizes and pitches.

Some embodiments may include a film on the surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
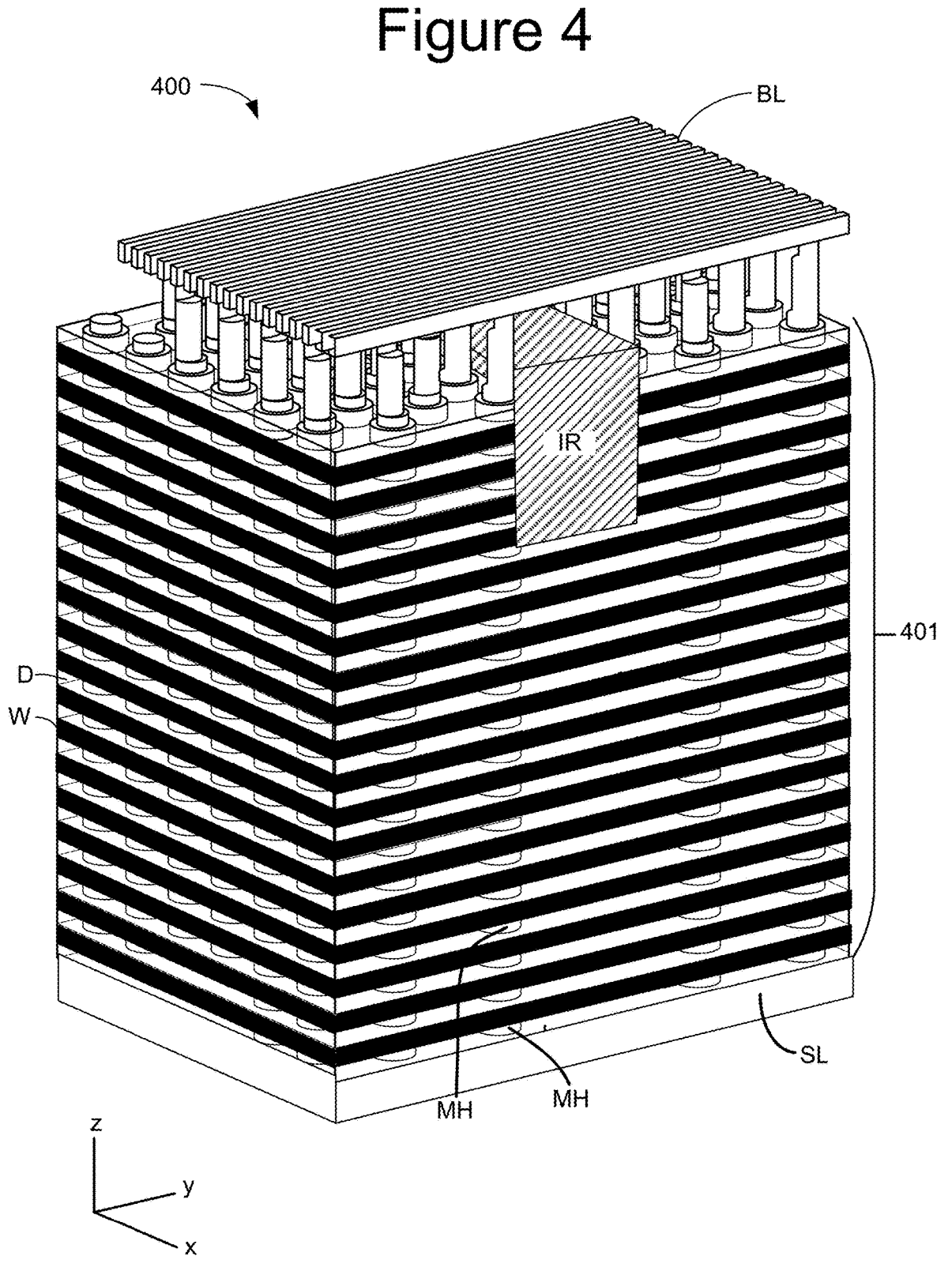
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality of non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into four or five (or a different number of) regions by isolation regions IR. FIG. 4 shows one isolation region IR separating two regions. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. Thus, the non-volatile memory cells are arranged in memory holes. More details of the three dimensional monolithic memory array that comprises memory structure 202 is provided below.

Figure 4A:
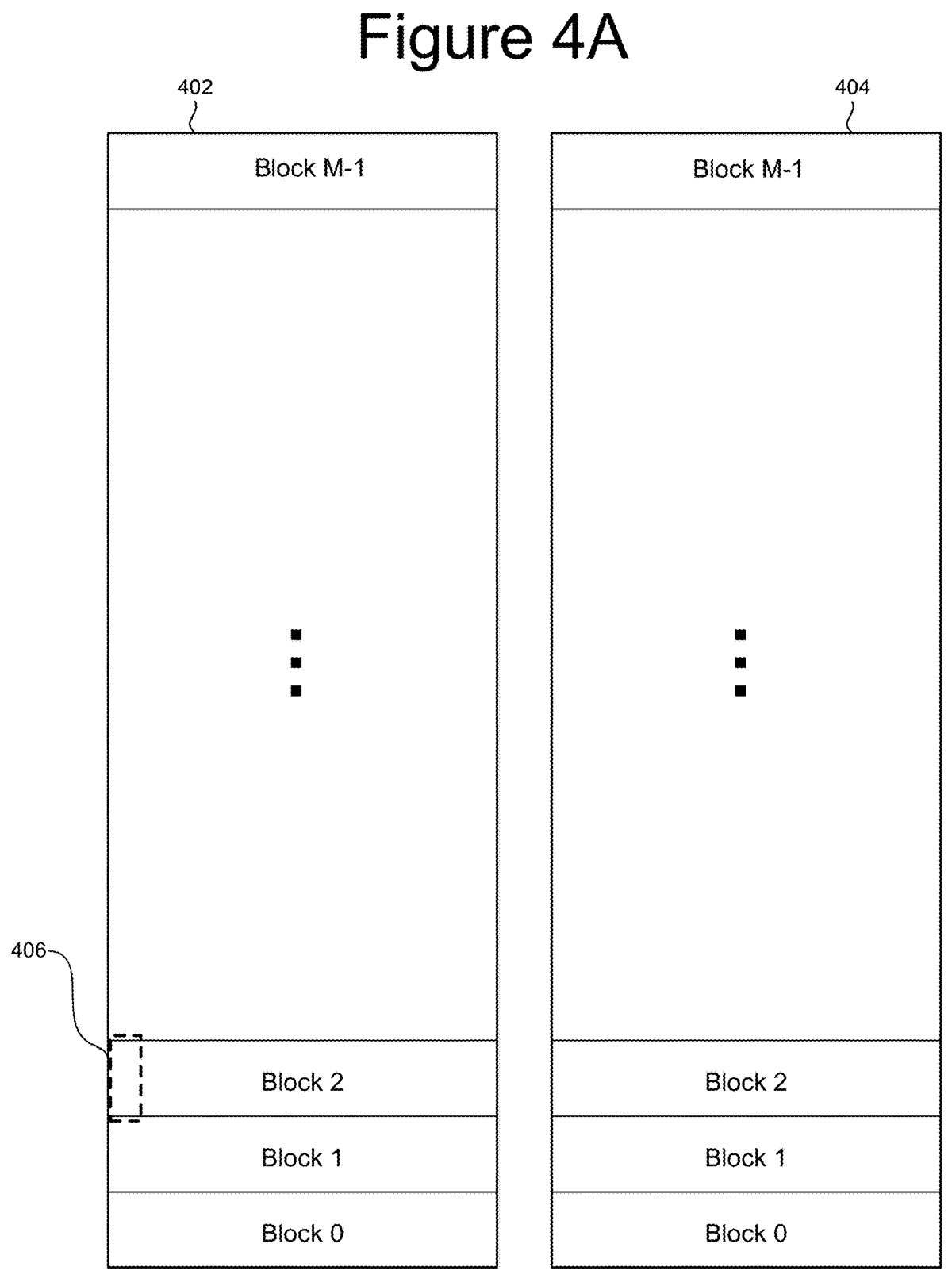

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a group of connected memory cells as the memory cells of a block share a common set of word lines. For example, the word lines for a block are all connected to all of the vertical NAND strings for that block. Although FIG. 4A shows two planes 402/404, more or less than two planes can be implemented. In some embodiments, memory structure 202 includes eight planes.

Figure 4B:
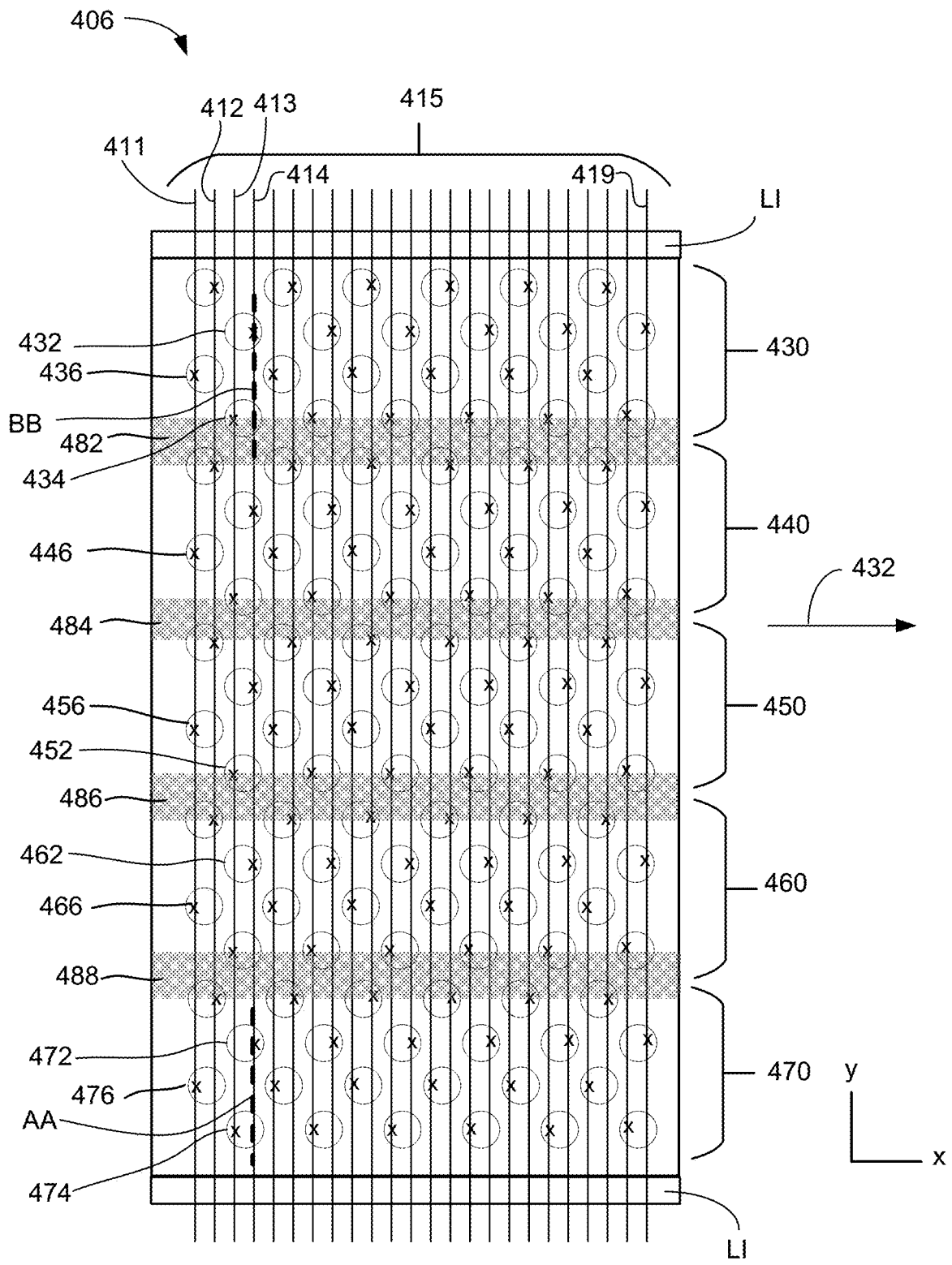
FIG. 4B depicts a top view of a portion of one embodiment of a block of memory cells.

FIGS. 4B-4G depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the memory holes, which are also referred to as vertical columns. Each of the memory holes/vertical columns include multiple select transistors (also referred to as a select gate or selection gate) and multiple memory cells. In one embodiment, each memory hole/vertical column implements a NAND string. For example, FIG. 4B labels a subset of the memory holes/vertical columns/NAND strings 432, 436, 446, 456, 462, 466, 472, 474 and 476.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to memory holes/vertical columns of the block. Each of the circles representing memory holes/vertical columns has an "x" to indicate its connection to one bit line. For example, bit line 411 is connected to memory holes/vertical columns 436, 446, 456, 466 and 476.

The block depicted in FIG. 4B includes a set of isolation regions 482, 484, 486 and 488, which are formed of $SiO_2$; however, other dielectric materials can also be used. Isolation regions 482, 484, 486 and 488 serve to divide the top layers of the block into five regions; for example, the top layer depicted in FIG. 4B is divided into regions 430, 440, 450, 460 and 470. In one embodiment, the isolation regions only divide the layers used to implement select gates so that NAND strings in different regions can be independently selected. In one example implementation, a bit line connects to one memory hole/vertical column/NAND string in each of regions 430, 440, 450, 460 and 470. In that implementation, each block has twenty-four rows of active columns and each bit line connects to five rows in each block. In one embodiment, all of the five memory holes/vertical columns/NAND strings connected to a common bit line are connected to the same set of word lines; therefore, the system uses the drain side selection lines to choose one (or another subset) of the five to be subjected to a memory operation (program, verify, read, and/or erase).

FIG. 4B also shows Line Interconnects LI, which are metal connections to the source line SL from above the memory array. Line Interconnects LI are positioned adjacent regions 430 and 470.

Although FIG. 4B shows each region 430, 440, 450, 460 and 470 having four rows of memory holes/vertical columns, five regions and twenty-four rows of memory holes/vertical columns in a block, those exact numbers are an example implementation. Other embodiments may include more or less regions per block, more or less rows of memory holes/vertical columns per region and more or less rows of vertical columns per block. FIG. 4B also shows the memory holes/vertical columns being staggered. In other embodiments, different patterns of staggering can be used. In some embodiments, the memory holes/vertical columns are not staggered.

Figure 4C:
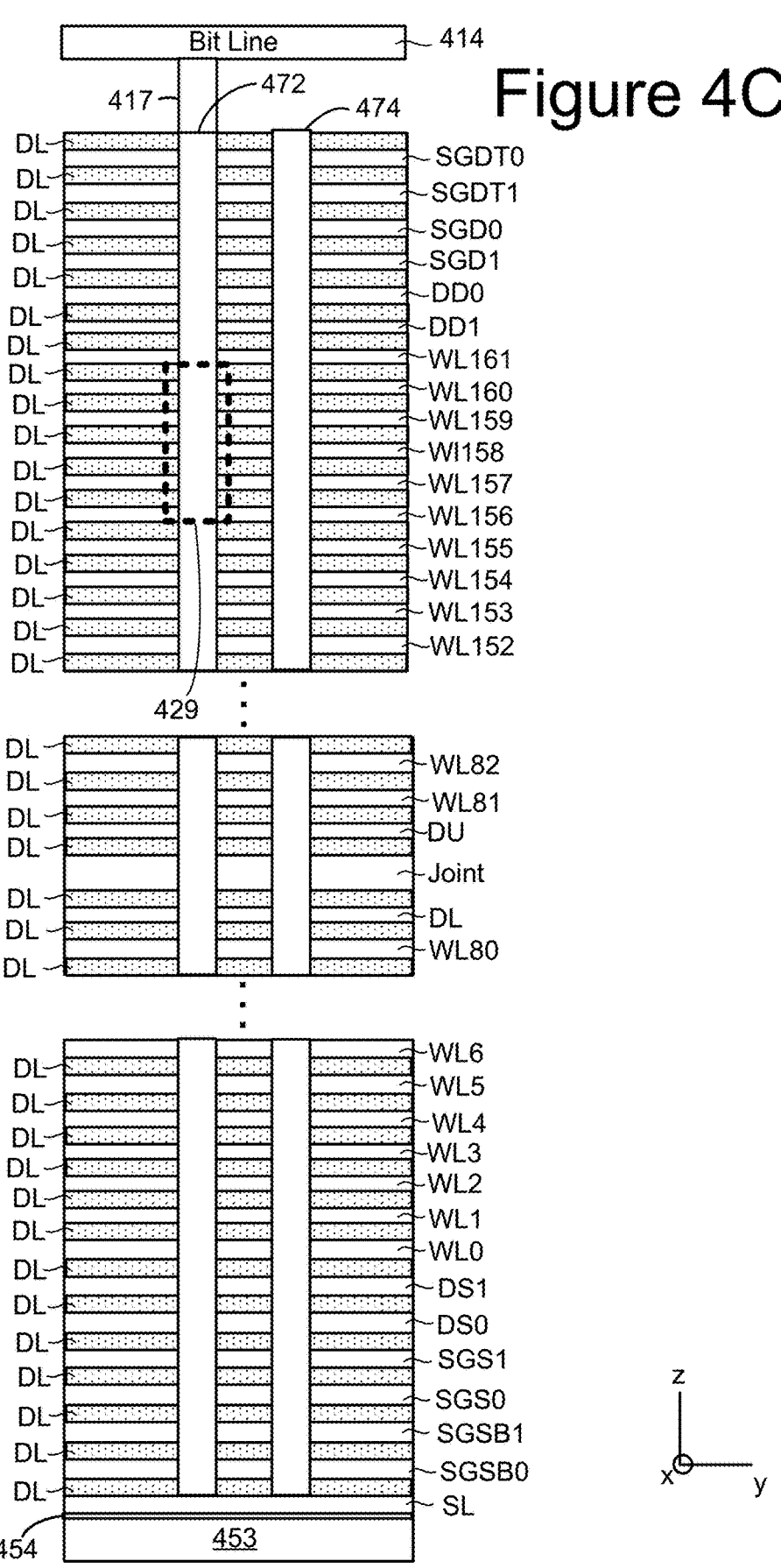
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through memory holes/vertical columns (NAND strings) 472 and 474 of region 470 (see FIG. 4B). The structure of FIG. 4C includes two drain side select layers SGD0 and SGD1; teo source side select layers SGS0 and SGS1; two drain side GIDL generation transistor layers SGDT0 and SGDT1; two source side GIDL generation transistor layers SGSB0 and SGSB1; two drain side dummy word line layers DD0 and DD1; two source side dummy word line layers DS0 and DS1; dummy word line layers DU and DL; one hundred and sixty two word line layers WL0-WL161 for connecting to data memory cells, and dielectric layers DL. Other embodiments can implement more or less than the numbers described above for FIG. 4C. In one embodiment, SGD0 and SGD1 are connected together; and SGS0 and SGS1 are connected together. In other embodiments, more or less number of SGDs (greater or lesser than two) are connected together, and more or less number of SGSs (greater or lesser than two) connected together.

In one embodiment, erasing the memory cells is performed using gate induced drain leakage (GIDL), which includes generating charge carriers at the GIDL generation transistors such that the carriers get injected into the charge trapping layers of the NAND strings to change the threshold voltage of the memory cells. FIG. 4C shows two GIDL generation transistors at each end of the NAND string; however, in other embodiments there are more or less than three. Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

FIG. 4C shows two GIDL generation transistors at each end of the NAND string. It is likely that charge carriers are only generated by GIDL at one of the two GIDL generation transistors at each end of the NAND string. Based on process variances during manufacturing, it is likely that one of the two GIDL generation transistors at an end of the NAND string is best suited for GIDL. For example, the GIDL generation transistors have an abrupt pn junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

Memory holes/Vertical columns 472 and 474 are depicted protruding through the drain side select layers, source side select layers, dummy word line layers, GIDL generation transistor layers and word line layers. In one embodiment, each memory hole/vertical column comprises a vertical NAND string. Below the memory holes/vertical columns and the layers listed below is substrate 453, an insulating film 454 on the substrate, and source line SL. The NAND string of memory hole/vertical column 472 has a source end at a bottom of the stack and a drain end at a top of the stack. As in agreement with FIG. 4B, FIG. 4C show vertical memory hole/column 472 connected to bit line 414 via connector 417.

For ease of reference, drain side select layers, source side select layers, dummy word line layers, GIDL generation transistor layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof. In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-WL161 connect to memory cells (also called data memory cells). Dummy word line layers connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Data word lines are word lines connected to data memory cells. Drain side select layers SGD0 and SGD1 are used to electrically connect and disconnect NAND strings from bit lines. Source side select layers SGS0 and SGS1 are used to electrically connect and disconnect NAND strings from the source line SL.

FIG. 4C shows that the memory array is implemented as a two-tier architecture, with the tiers separated by a Joint area. In one embodiment it is expensive and/or challenging to etch so many word line layers intermixed with dielectric layers. To case this burden, one embodiment includes laying down a first stack of word line layers (e.g., WL0-WL80) alternating with dielectric layers, laying down the Joint area, and laying down a second stack of word line layers (e.g., WL81-WL161) alternating with dielectric layers. The Joint area are positioned between the first stack and the second stack. In one embodiment, the Joint areas are made from the same materials as the word line layers. In other embodiments, there can no Joint area or there can be multiple Joint areas.

Figure 4D:
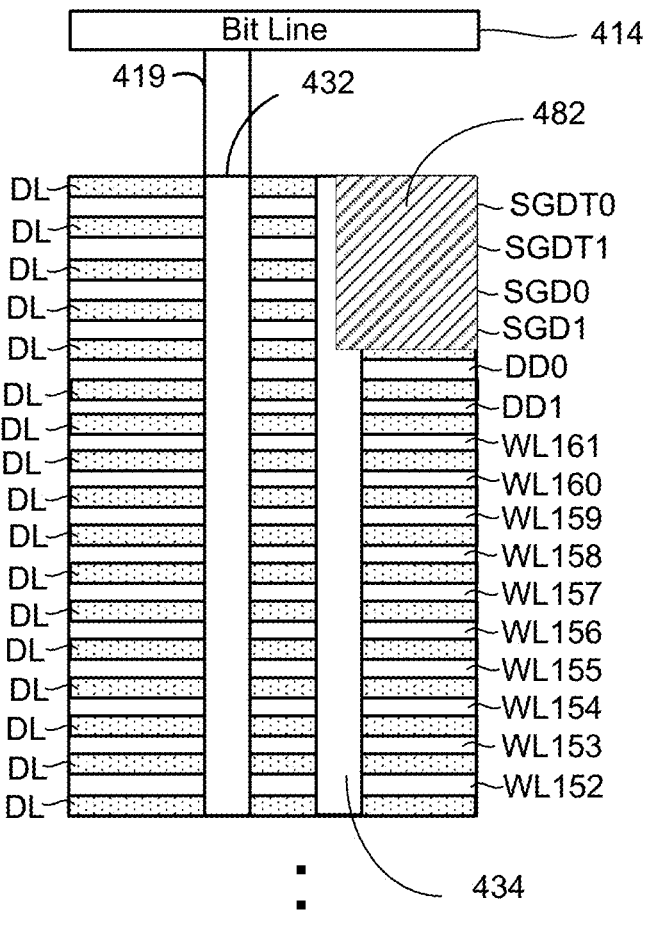
FIG. 4D depicts a cross sectional view of a portion of one embodiment of a block of memory cells.

FIG. 4D depicts a portion of one embodiment of a three-dimensional memory structure 202 showing a cross-sectional view along line BB of FIG. 4B. This cross sectional view cuts through memory holes/vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 482, 484, 486 and 488 occupy space that would have been used for a portion of the memory holes/vertical columns/NAND strings. For example, isolation region 482 occupies space that would have been used for a portion of memory hole/vertical column 434. More specifically, a portion (e.g., half the diameter) of vertical column 434 has been removed in layers SGDT0, SGDT1, SGD0, and SGD1 to accommodate isolation region 482. Thus, while most of the vertical column 434 is cylindrical (with a circular cross section), the portion of vertical column 434 in layers SGDT0, SGDT1, SGD0, and SGD1 has a semi-circular cross section. In one embodiment, after the stack of alternating conductive and dielectric layers is formed, the stack is etched to create space for the isolation region and that space is then filled in with $SiO_2$. This structure allows for separate control of SGDT0, SGDT1, SGD0, and SGD1 for regions 430, 440, 450, 460, and 470.

Figure 4E:
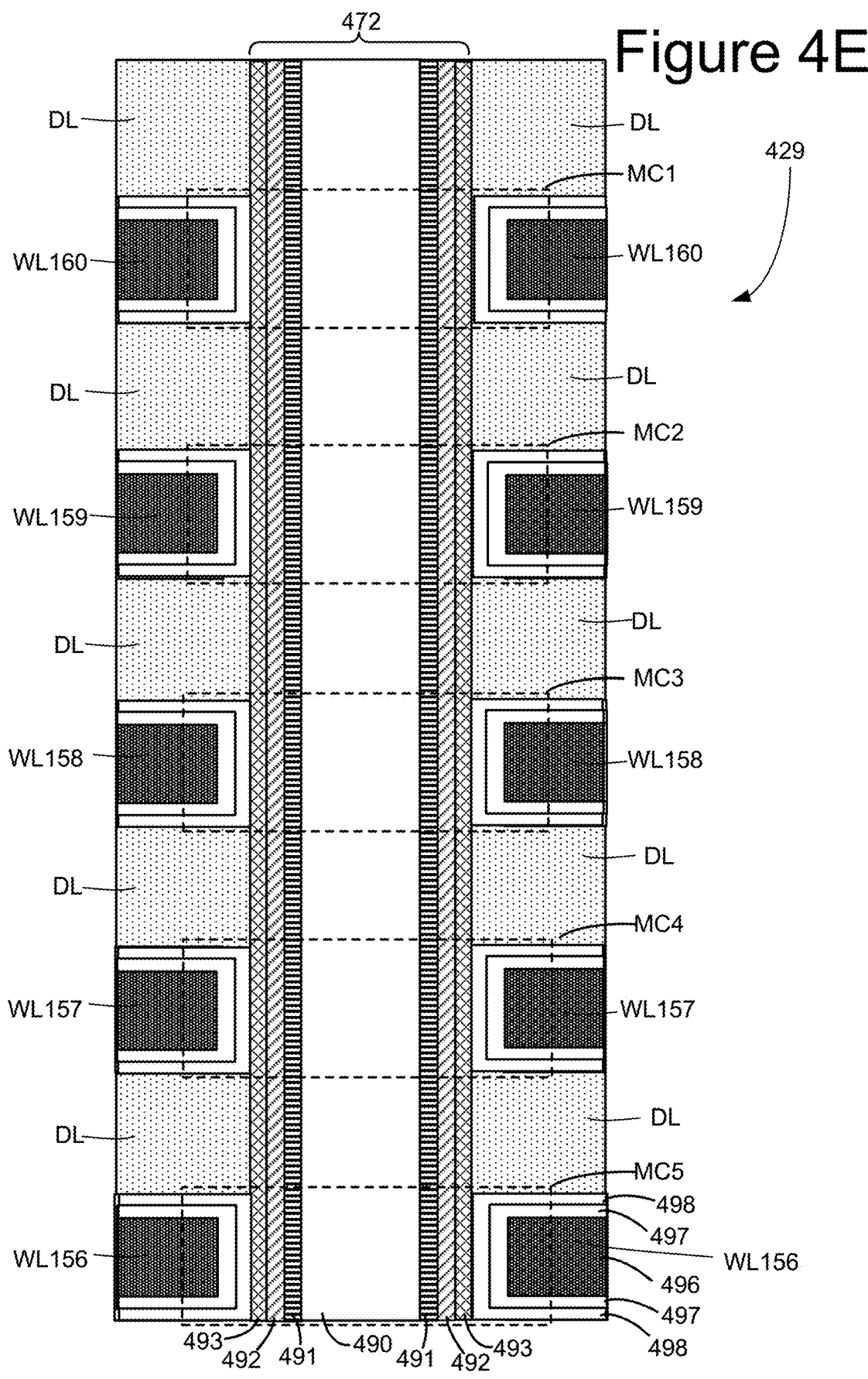
FIG. 4E is a cross sectional view of one embodiment of a vertical column of memory cells.

FIG. 4E depicts a cross sectional view of region 429 of FIG. 4C that includes a portion of memory hole/vertical column 472. In one embodiment, the memory holes/vertical columns are round; however, in other embodiments other shapes can be used. In one embodiment, memory hole/vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4E depicts dielectric layers DL as well as word line layers WL160, WL159, WL158, WL157, and WL156. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL160 and a portion of memory hole/vertical column 472 comprise a memory cell MC1. Word line layer WL159 and a portion of memory hole/vertical column 472 comprise a memory cell MC2. Word line layer WL158 and a portion of memory hole/vertical column 472 comprise a memory cell MC3. Word line layer WL157 and a portion of memory hole/vertical column 472 comprise a memory cell MC4. Word line layer WL156 and a portion of memory hole/vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4F:
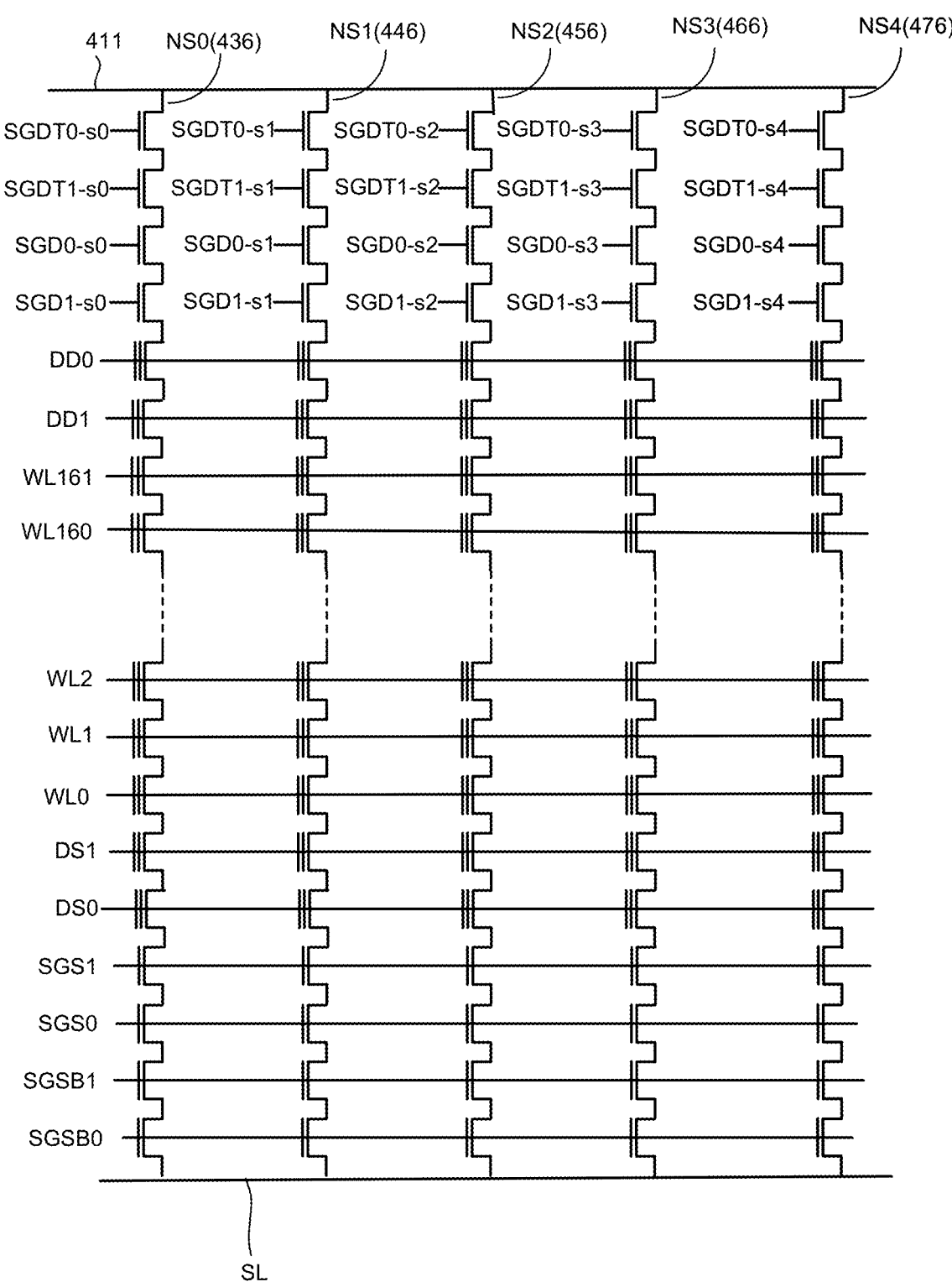
FIG. 4F is a schematic of a plurality of NAND strings in multiple regions of a same block.

FIG. 4F is a schematic diagram of a portion of the three-dimensional memory array 202 depicted in FIGS. 4-4E. FIG. 4F shows physical data word lines WL0-WL161 running across one entire block. The structure of FIG. 4F corresponds to a portion 406 in Block 2 of FIG. 4A, including bit line 411. Within the block, in one embodiment, each bit line is connected to five NAND strings, one in each region of regions 430, 440, 450, 460, 470. Thus, FIG. 4F shows bit line 411 connected to NAND string NS0 (which corresponds to memory hole/vertical column 436 of region 430), NAND string NS1 (which corresponds to memory hole/vertical column 446 of region 440), NAND string NS2 (which corresponds to vertical column 456 of region 450), NAND string NS3 (which corresponds to memory hole/vertical column 466 of region 460), and NAND string NS4 (which corresponds to memory hole/vertical column 476 of region 470).

Drain side select line/layer SGD0 is separated by isolation regions 482, 484, 486 and 488 to form SGD0-s0, SGD0-s1, SGD0-*s*2, SGD0-*s*3 and SGD0-*s*4 in order to separately connect to and independently control regions 430, 440, 450, 460, 470. Similarly, drain side select line/layer SGD1 is separated by isolation regions 482, 484, 486 and 488 to form SGD1-*s*0, SGD1-*s*1, SGD1-*s*2, SGD1-*s*3 and SGD1-*s*4 in order to separately connect to and independently control regions 430, 440, 450, 460, 470; drain side GIDL generation transistor control line/layer SGDT0 is separated by isolation regions 482, 484, 486 and 488 to form SGDT0-*s*0, SGDT0-*s*1, SGDT0-*s*2, SGDT0-*s*3 and SGDT0-*s*4 in order to separately connect to and independently control regions 430, 440, 450, 460, 470; drain side GIDL generation transistor control line/layer SGDT1 is separated by isolation regions 482, 484, 486 and 488 to form SGDT1-*s*0, SGDT1-*s*1, SGDT1-*s*2, SGDT1-*s*3 and SGDT1-*s*4 in order to separately connect to and independently control regions 430, 440, 450, 460, 470.

FIG. 4F only shows NAND strings connected to bit line 411. However, a full schematic of the block would show every bit line and five vertical NAND strings (that are in separate regions) connected to each bit line.

Although the example memories of FIGS. 4-4F are three-dimensional memory structure that include vertical NAND strings with charge-trapping material, other (2D and 3D) memory.

Figure 5A:
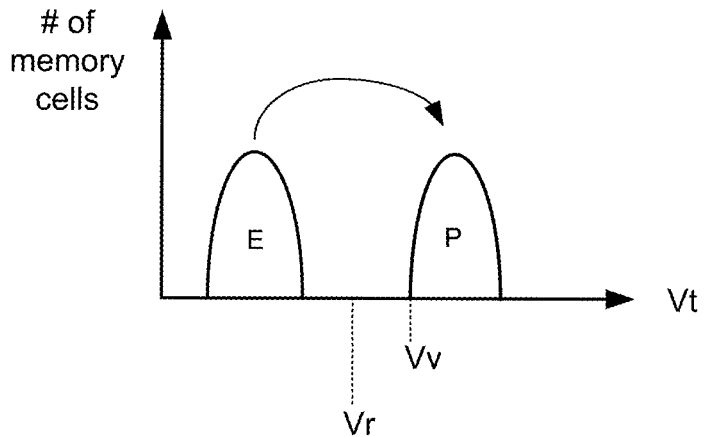
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cell is erased (state E) or programmed (state P). FIG. 5A also depicts verify reference voltage Vv. In some embodiments, when programming memory cells to data state P, the system will test whether those memory cells have a threshold voltage greater than or equal to Vv.

Figure 5B:
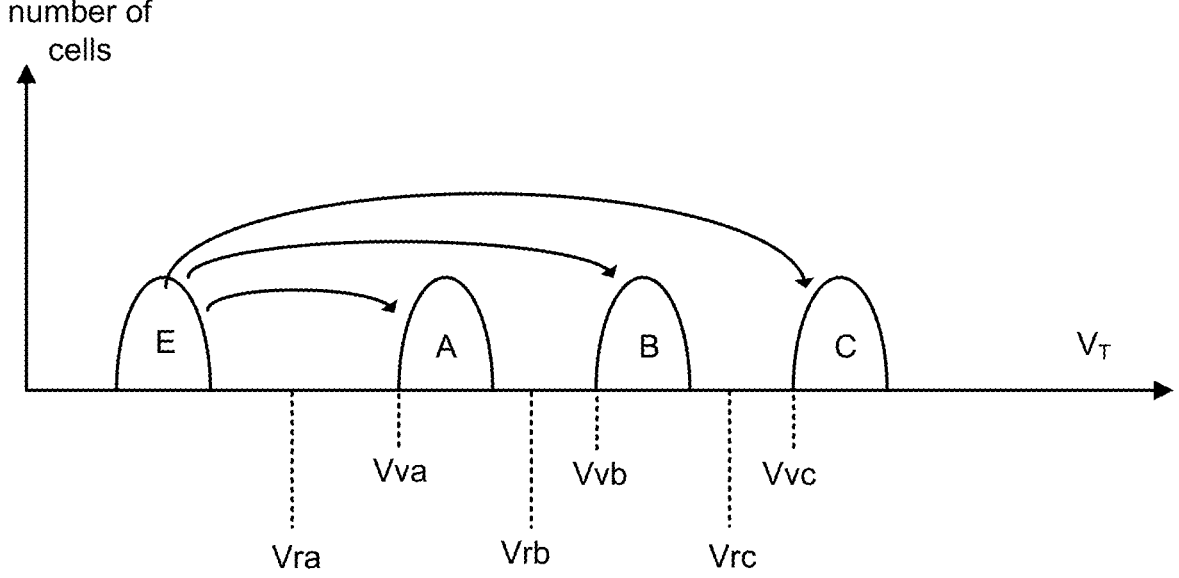
FIG. 5B depicts threshold voltage distributions.

FIGS. 5B-D illustrate example threshold voltage distributions for the memory array when each memory cell stores multiple bit per memory cell data. Memory cells that store multiple bits per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, or five bits of data per memory cell). In one embodiment, programming (or writing) is the process of changing the threshold voltage of one or more memory cells from a an erased data state to a programmed data state.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|  | E | A | B | C |
|---|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cell (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|  | Er | A | B | C | D | E | F | G |
|---|---|---|---|---|---|---|---|---|
| UP | 1 | 1 | 1 | 0 | 0 | 0 | 0 | 1 |
| MP | 1 | 1 | 0 | 0 | 1 | 1 | 0 | 0 |
| LP | 1 | 0 | 0 | 0 | 0 | 1 | 1 | 1 |

FIG. 5C shows seven read reference voltages, VrA, VrB, VIC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is an erase verify reference voltage to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state Er to data state A, other memory cells are being programmed from data state Er to data state B and/or from data state Er to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages/ levels VrA, VrB, VrC, VrD, VrE, VrF, and VrG, of FIG. 5C) or verify operation (e.g. see verify target voltages/levels VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturbance can unintentionally increase the threshold voltage of a memory cell. Likewise, read disturbance can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. Note that in some embodiments, the threshold voltage distributions for a population of memory cells storing four bits of data per memory cell do not overlap and are separated from each other. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|     | S0 | S1 | S2 | S3 | S4 | S5 | S6 | S7 | S8 | S9 | S10 | S11 | S12 | S13 | S14 | S15 |
|-----|----|----|----|----|----|----|----|----|----|----|-----|-----|-----|-----|-----|-----|
| TP  | 1  | 1  | 1  | 1  | 1  | 0  | 0  | 0  | 0  | 0  | 1   | 1   | 0   | 0   | 0   | 1   |
| UP  | 1  | 1  | 0  | 0  | 0  | 0  | 0  | 0  | 1  | 1  | 1   | 1   | 1   | 1   | 0   | 0   |
| MP  | 1  | 1  | 1  | 0  | 0  | 0  | 0  | 1  | 1  | 0  | 0   | 0   | 0   | 1   | 1   | 1   |
| LP  | 1  | 0  | 0  | 0  | 1  | 1  | 0  | 0  | 0  | 0  | 0   | 1   | 1   | 1   | 1   | 1   |

Figure 6:
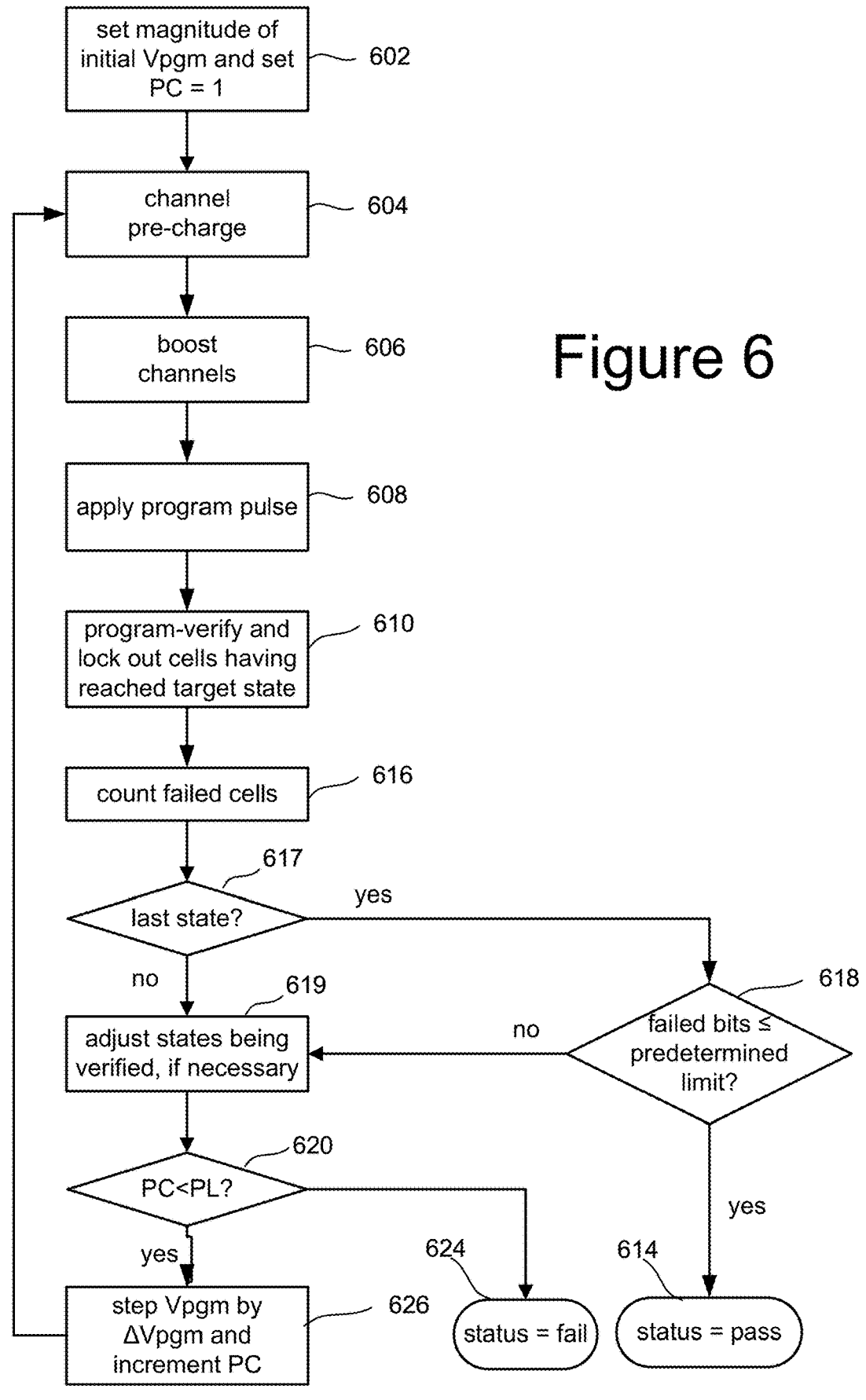
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program voltage pulses. Between program voltage pulses are a set of verify pulses (e.g., voltage pulses) to perform verification. In many implementations, the magnitude of the program voltage pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program-verify is performed, which includes testing whether memory cells being programmed have successfully reached their target data state. Memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

In one embodiment of step 610, a smart verify technique is used such that the system only verifies a subset of data states during a program loop (steps 604-626). For example, the first program loop includes verifying for data state A (see FIG. 5C), depending on the result of the verify operation the second program loop may perform verify for data states A and B, depending on the result of the verify operation the third program loop may perform verify for data states B and C, and so on.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 617, the system determines whether the verify operation in the latest performance of step 610 included verifying for the last data state (e.g., data state G of FIG. 5C). If so, then in step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, then the programming process can stop and a status of "PASS" is reported in step 614. In this situation, enough memory cells are programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If in step 617 it was determined that the verify operation in the latest performance of step 610 did not include verifying for the last data state or in step 618 it was determined that the number of failed memory cells is not less than the predetermined limit, then in step 619 the data states that will be verified in the next performance of step 610 (in the next program loop) is adjusted as per the smart verify scheme discussed above. In step 620, the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process continues at step 604 and another program pulse is applied to the selected word line (by the control die) so that another program loop (steps 604-626) of the programming process of FIG. 6 is performed.

In one embodiment memory cells are erased prior to programming. Erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D. In one embodiment, the control circuit is configured to program memory cells in the direction from the erased data state toward the highest data state (e.g., from data state Er to data state G) and erase memory cells in the direction from the highest data state toward the erased data state (e.g., from data state G to data state Er).

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the memory cells. Herein, this is referred to as p-well erase.

Another approach to erasing memory cells is to generate gate induced drain leakage ("GIDL") current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a GIDL generation transistor (e.g., transistors connected to SGDT0, SGDT1, SGSB0, and SGSB1). In some embodiments, a select gate (e.g., SGD or SGS) can be used as a GIDL generation transistor. A transistor drain-to-gate voltage that generates a GIDL current is referred to herein as a GIDL voltage. The GIDL current may result when the GIDL generation transistor drain voltage is significantly higher than the GIDL generation transistor control gate voltage. GIDL current is a result of carrier generation, i.e., electron-hole pair generation due to band-to-band tunneling and/or trap-assisted generation. In one embodiment, GIDL current may result in one type of carriers (also referred to a charge carriers), e.g., holes, predominantly moving into the NAND channel, thereby raising or changing the potential of the channel. The other type of carriers, e.g., electrons, are extracted from the channel, in the direction of a bit line or in the direction of a source line by an electric field. During erase, the holes may tunnel from the channel to a charge storage region of the memory cells (e.g., to charge trapping layer 493) and recombine with electrons there, to lower the threshold voltage of the memory cells.

The GIDL current may be generated at either end (or both ends) of the NAND string. A first GIDL voltage may be created between two terminals of a GIDL generation transistor (e.g., connected to SGDT0, SGDT1) that is connected to or near a bit line to generate a first GIDL current. A second GIDL voltage may be created between two terminals of a GIDL generation transistor (e.g., SGSB0, SGSB1) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase. The technology described herein can be used with one-sided GIDL erase and two-sided GIDL erase.

Figure 7:
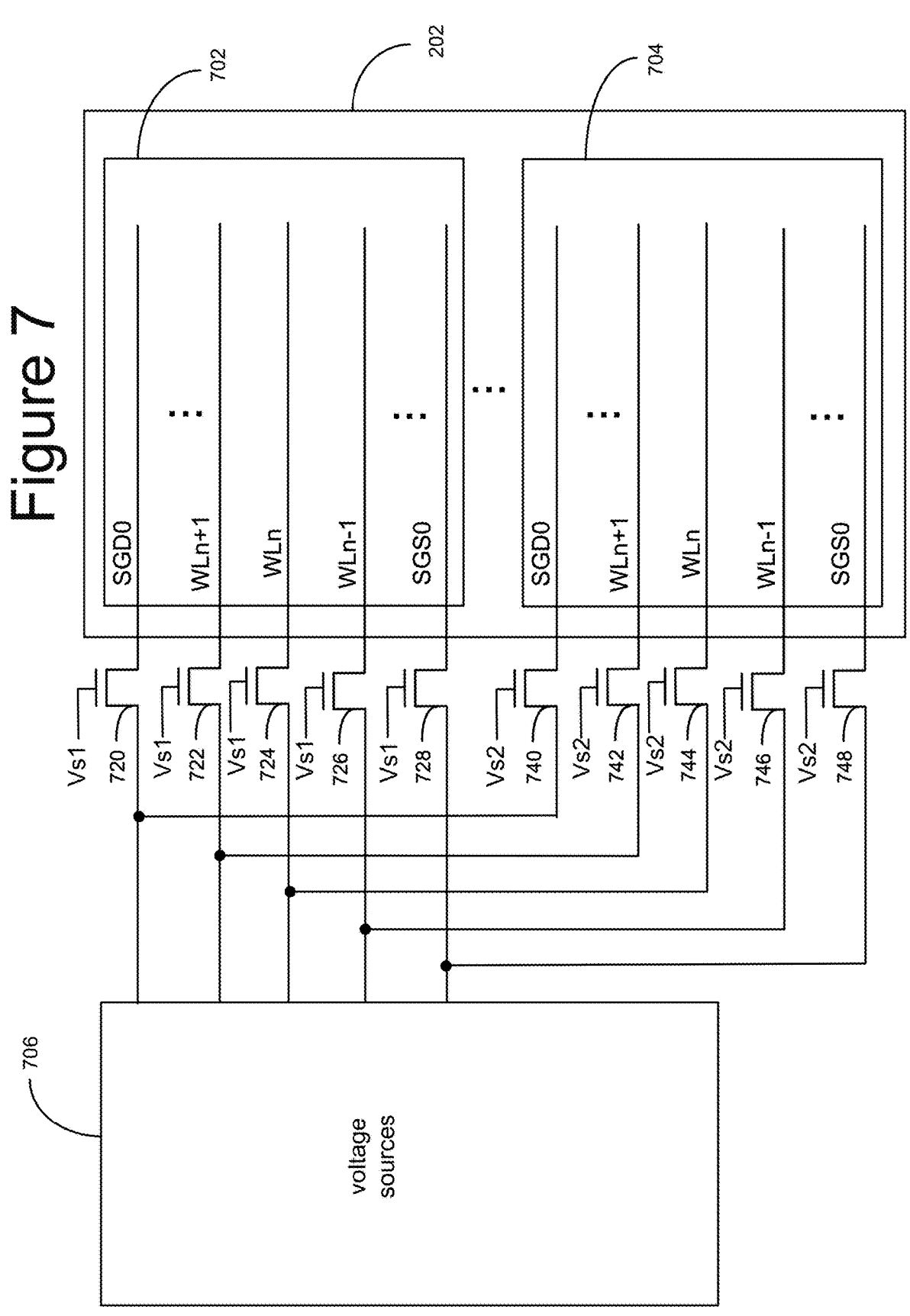
FIG. 7 is a block diagram of word line switch transistors connected to word lines of multiple blocks of memory cell.

Word line switches are used to connect word lines to sources of voltage in order to perform memory operations. FIG. 7 depicts a schematic diagram depicting a plurality of word line switches connected to the word lines and one or more sources of voltage. For memory array 202, FIG. 7 shows block 702 and block 704; however, more than two blocks would be included in memory array 202. FIG. 7 only shows two blocks to make the drawing easier to read. The word lines may comprise data word lines, dummy word lines and select lines. FIG. 7 shows a plurality of word lines extending across the memory. For example, for both blocks 702 and 704, the word line depicted include SGS0 . . . WLn−1, WLn, WLn+1, . . . SGD0. The other word lines of the blocks are not explicitly depicted to make the drawing easier to read. For block 702, FIG. 7 shows word lines switch transistor 720 connected to SGD0, word line switch transistor 722 connected to WLn+1, word line switch transistor 724 connected to WLn, word line switch transistor 726 connected to WLn 1 and word line switch transistor 728 connected to SGS0. For block 704, FIG. 7 shows word line transistor 740 connected to SGD0, word line switch transistor 742 connected to WLn+1, word line switch transistor 744 connected to WLn, word line switch transistor 746 connected to WLn−1 and word line switch transistor 748 connected to SGS0.

Each of the word line switch transistors 720-748 have their input terminal connected to voltage sources 706 for receiving a voltage to be transferred to the respective word lines via the output terminals. Voltage sources 706 (which can be part of the control circuit described above) includes one or more voltage sources that provide voltage signals (for programming, reading and erasing) which are transferred to the word lines via the plurality of word line switch transistors. The voltage sources can include charge pumps and other sources of voltage.

The control circuit (not depicted in FIG. 7), such as state machine 262, provides various selection signals (one or more selection voltages or one or more deselect voltages) to the selection terminals of the word line switch transistor. For example, signal VS1 is provided to word line switches 720, 722, 724, 726 and 728; and signal Vs2 is provided to word line switches 740, 742, 744, 746 and 748. In this manner, the word line switch transistors for a block can be turned on or turned off together so that the block is selected or not selected for a particular memory operation.

Users of non-volatile memory desire ever larger storage capacity in order to store more data. As the storage capacity of memory systems grow, the physical size of the memories can increase. One means for increasing the storage capacity of a non-volatile memory system is to add more layers to the three dimensional stack (e.g., see FIG. 4C). Each added layer adds a word line and memory cells connected to that word line. Adding more word lines requires more word line switches. Adding more word line switches requires more space on the control die, thereby making the control die larger. To prevent the control die from getting too large due to the addition of word line switches, it is proposed to share word line switches between neighboring non-volatile memory arrays (e.g., neighboring planes). However, sharing word line switches between neighboring non-volatile memory arrays poses a challenge to route the outputs of the word line switches to the neighboring non-volatile memory arrays without adding new metal interconnect layers (also referred to as metal layers).

To implement shared word line switches with routing that does not result in additional metal layers, two types of routing will be used: high metal routing for some of the shared word line switches and low metal routing for some of the shared word line switches. For the high metal routing, lateral routing is implemented in high metal layers to enable a word line switch to connect to two neighboring non-volatile memory arrays. For the low metal routing, lateral routing is implemented in low metal layers to enable a word line switch to connect to two neighboring non-volatile memory arrays. More details are provided below.

Figure 8:
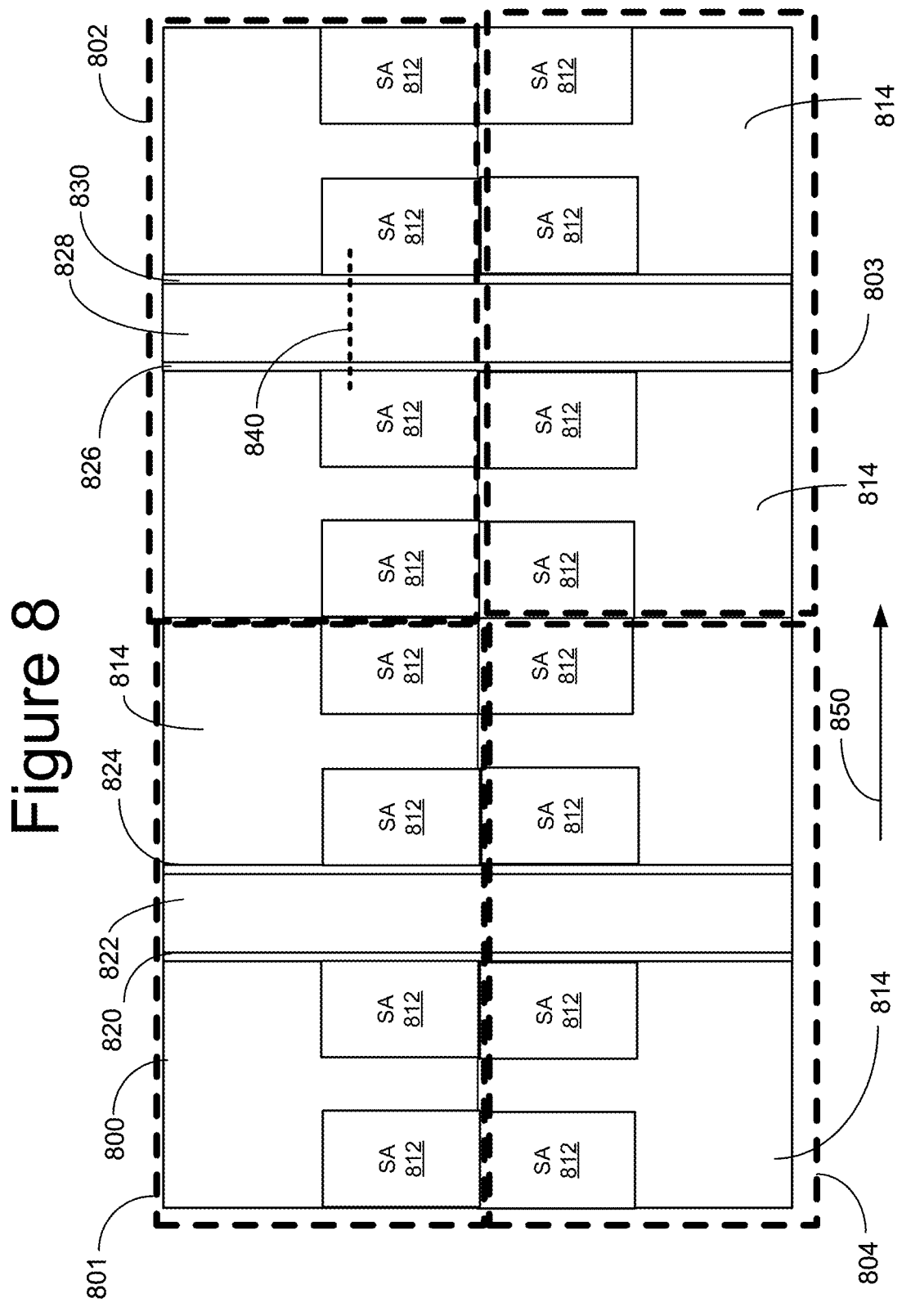
FIG. 8 is a block diagram depicting one embodiment of a floor plan for the control circuit(s) of a non-volatile memory system.

FIG. 8 is a block diagram depicting one embodiment of a floor plan for the control circuit(s) 800 of a non-volatile memory system. In one example, the floor plan 800 of FIG. 8 is for control die 211 of integrated memory assembly 2007. The floor plan indicates the location of the various components of control circuit(s) 800.

In one embodiment, the memory includes four physical planes that are referred to as Plane PB0, Plane PB1, Plane PB2 and Plan3 PB3. Control circuit(s) 800 of control die 211 connects to and supports the four physical planes (PB0, PB1, PB2 and PB3). For example, box 801 depicts the portion of control circuit(s) 800 that is located under Plane PB0, connected to PB0 and supports PB1; box 802 depicts the portion of control circuit(s) 800 that is located under Plane PB1, connected to PB1 and supports PB1; box 803 depicts the portion of control circuit(s) 800 that is located under Plane PB2, connected to PB1 and supports PB1; and box

804 depicts the portion of control circuit(s) 800 that is located under Plane PB3, connected to PB1 and supports PB1. Other arrangements of the panes can also be implemented.

To make the drawing easier to read and to emphasize the depicted components, only a subset of the components of control circuit(s) 800 are specifically depicted. Open areas 814 are used for components of control circuit(s) 800 that are not specifically depicted in FIG. 8 (e.g., state machine 262, decoders, drivers, etc.). For example, FIG. 8 depicts multiple regions 812 for locating sense amplifiers (e.g., sense amplifiers 230 of FIGS. 2A and 2B). Control circuit(s) 800 also includes regions 822 and 828 for locating word line switches connected to data and dummy word lines, and regions 820/824/826/830 for locating word line switches connected to select gates (e.g., SGD0, SGD1, SGDT0, SGDT1, SGS0, SGS1, SGSB0, SGSB1).

Figure 9:
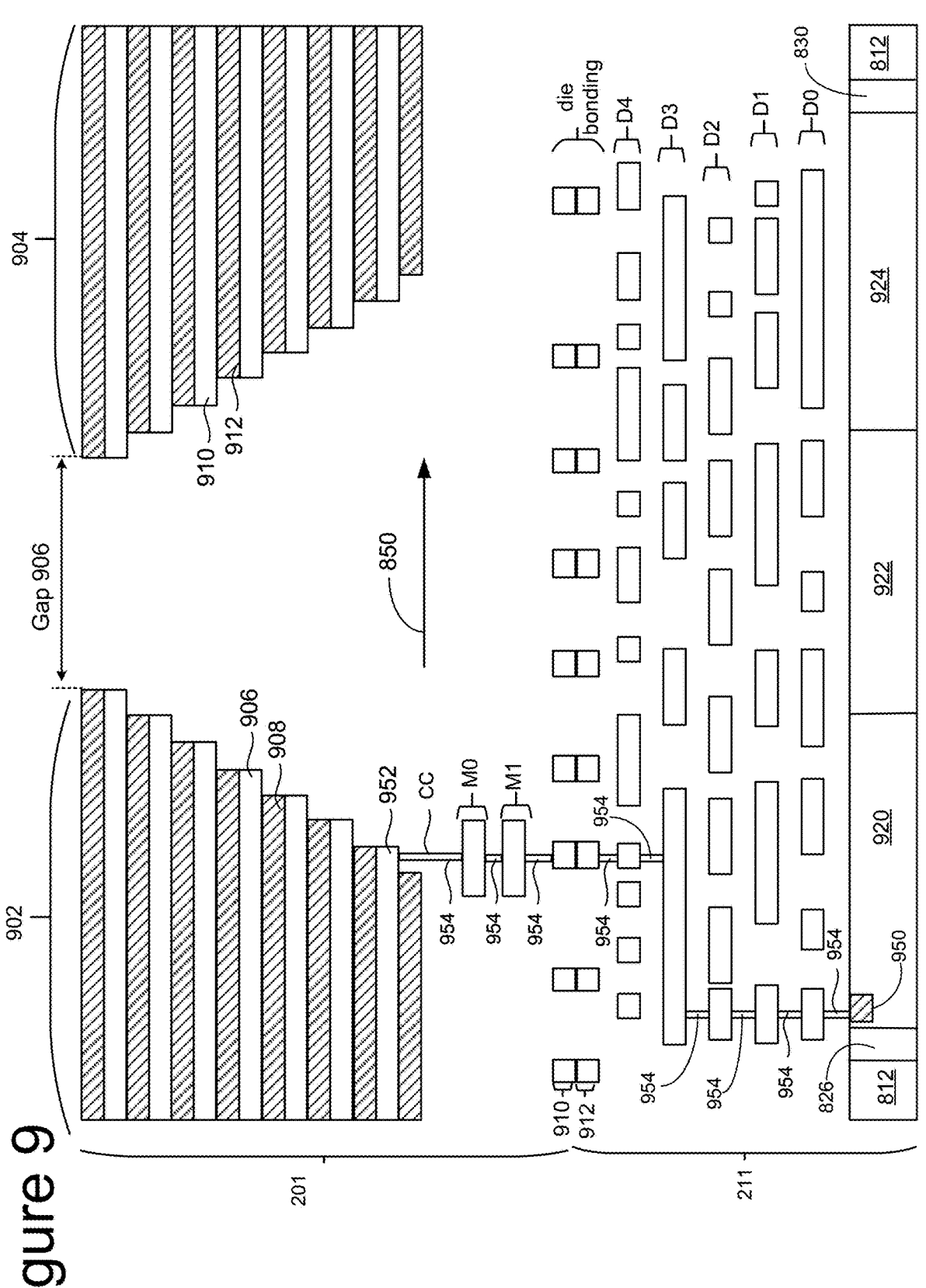
FIG. 9 is a cross section of an integrated memory assembly.
Figure 10:
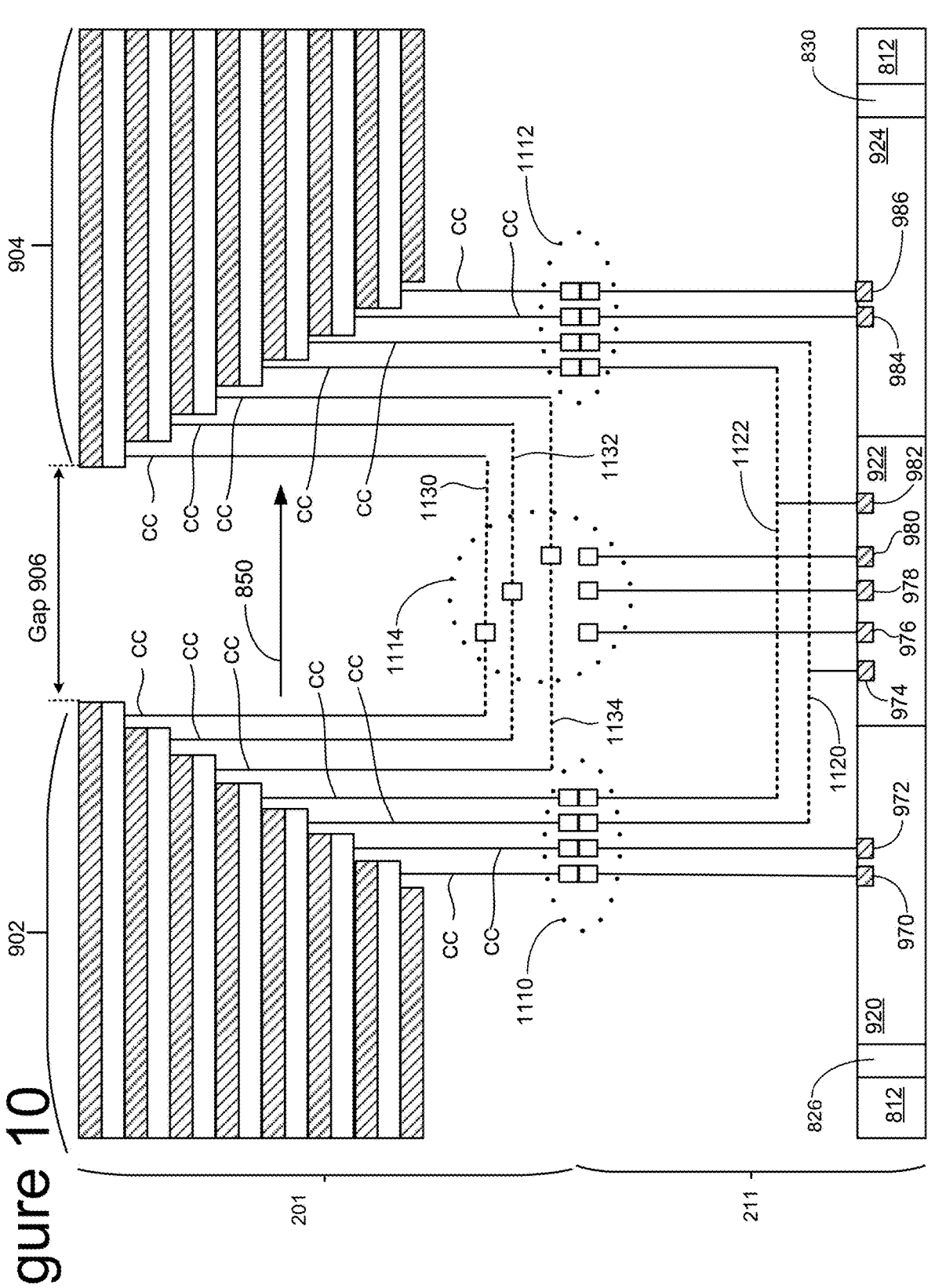
FIG. 10 is a cross section of an integrated memory assembly.

FIGS. 9 and 10 are cross sections of integrated memory assembly 207 along line 840. FIG. 9 depicts the various metal layers (D0, D1, D2, D3, D4, M0 and M1) for routing electrical signals and one example connection between a word line switch and a word line. FIG. 10 depicts the two types of routing for connecting a subset of word line switches: high metal routing for some of the shared word line switches and low metal routing for some of the shared word line switches.

FIG. 9 depicts memory die 201 positioned above control die 211. In one embodiment, each plane (including each block of each plane) is divided into two memory arrays (or two memory structures), each of which is a separate memory array (separate memory structure) with separate word lines. The two memory arrays are adjacent to each other. For example, FIG. 9 shows a first memory array 902 (e.g., a first non-volatile memory structure comprising a first plurality of non-volatile memory cells and word lines connected to the first plurality of non-volatile memory cells) adjacent to a second memory array 904 (e.g., a second non-volatile memory structure comprising a second plurality of non-volatile memory cells and word lines connected to the second plurality of non-volatile memory cells). Memory array 902 has separate word lines from memory array 904. Each of memory arrays 902 and 904 comprise a separate stack of alternating word lines and dielectric layers (as described above with respect to FIG. 4C). For example purposes, word line layers 906, 910 and 952 are labeled in FIG. 9, and dielectric layers 908 and 912 are labeled in FIG. 9. Memory arrays 902 and 904 have ends facing each other in a shape of a staircase (i.e., inverted staircase). Memory arrays 902 and 904 are separated from each other by a gap 906. Memory die 201 includes two metal layers for routing electrical signals: M0 and M1. M0 is positioned above M1 and below memory arrays 902 and 904.

FIG. 4C (see discussion above) depicts 162 word line layers. In one embodiment where each block is divided into two memory arrays, each of the memory arrays will have 162 word lines so that the bock has a total of 324 word lines. In other embodiments, different amounts of word lines can be implemented.

Control die 211 includes control circuit(s) 800 on the top surface of the substrate that is connected to memory array 902 and memory array 904. The portion of control circuit(s) 800 depicted in FIG. 9 includes a subset of regions 812 for locating sense amplifiers, region 828 for locating word line switches, and regions 826/830 for locating word line switches connected to select gates. In FIG. 9, region 828 for locating word line switches is divided into sub-region 920 for locating word line switches connected only to word lines of memory array 902, sub-region 924 for locating word line switches connected only to word lines of memory array 904, and sub-region 922 for locating shared word line switches connected to word lines of both memory array 902 and memory array 904. Memory die 201 includes five metal layers for routing electrical signals: D0, D1, D2, D3 and D4. Only portions of metal layers M0, M1, D0, D1, D2, D3 and D4 are depicted in FIG. 9 for illustrative purposes. In one embodiment, memory die 201 (one example of a semiconductor die) is bonded to control die 211 (another example of a semiconductor die) via bonding pads 910 on memory die 201 and bonding pads 912 on control die 211.

As an example, FIG. 9 shows word line switch 950 in region 920 connected to word line 952 of memory array 902 via pathway 954 through metal layers M0, M1, D0, D1, D2, D3 and D4.

As discussed above, to implement shared word line switches with routing that does not result in additional metal layers, two types of routing will be used: high metal routing for some of the shared word line switches and low metal routing for some of the shared word line switches. In the embodiment of FIGS. 9 and 10, metal layers M0/M1 are the high metal layers for high metal routing and metal layers D0/D1/D2/D3/D4 are the low metal layers for the low metal routing. The one or more low metal layers D0/D1/D2/D3/D4 are positioned above the sub-regions (920/922/924). The one or more high metal layers M0/M1 are positioned above the one or more low metal layers D0/D1/D2/D3/D4. The one or more high metal layers M0/M1 are positioned below non-volatile memory arrays 902/904.

FIG. 9 also depicts arrow 850, which indicates a lateral direction from between the memory array 902 and memory array 904 toward one or more of memory array 902 and memory array 904. In addition to the bonding pads 912, control die 211 includes another interface (e.g., see interface 268 of FIG. 2B) for connecting to memory controller 120 (which is physically separate from memory die 201 and control die 211).

FIG. 10 depicts the two types of routing for connecting a subset of word line switches: high metal routing for some of the shared word line switches and low metal routing for some of the shared word line switches. For example, a first subset of the word line switches (e.g., shared word line switches 974 and 982) connected to a first set of word lines of memory array 902 and a second set of word lines of memory array 904 via bonding pads 1110/1112 and via routing within one or more of the low metal layers in a lateral direction from between memory array 902 and memory array 904 toward one or more of memory array 902 and memory array 904 (as depicted by arrow 850). Dashed lines 1120 and 1122 depict routing within one or more of metal layers D0/D1/D2/D3/D4 in the lateral direction (as depicted by arrow 850). The output of word line switch 974 is routed to two vias in D0/D1/D2/D3/D4 by the pathway of dashed line 1120: one of the vias provides communication to a word line in memory array 902 (through one of the bonding pads 1110) and one of the vias provides communication to a word line in memory array 904 (through one of the bonding pads 1112). The output of word line switch 982 is routed to two vias in D0/D1/D2/D3/D4 by the pathway of dashed line 1122: one of the vias provides communication to a word line in memory array 902 (through one of the bonding pads 1110) and one of the vias provides communication to a word line in memory array 904 (through one of the bonding pads 1112). Note that vias in the vertical direction between metal layers are not in the lateral direction as they are in the vertical directions. Similarly, routing within a metal layer in the direction into the page, orthogonal to arrow 850, is also not the lateral direction (as defined above) because it is not in the direction from between memory array 902 and memory array 904 toward one or more of memory array 902 and memory array 904. Note that the only lateral routing of the output of the first subset of the word line switches is within one or more of metal layers D0/D1/D2/D3/D4 (low metal layers).

A second subset of the word line switches (e.g., shared word line switches 976, 978 and 980) are connected to a third set of word lines of memory array 902 and a fourth set of word lines of memory array 904 via bonding pads 1114 and via routing within one or more of the high metal layers in the lateral direction from between memory array 902 and memory array 904 toward one or more of memory array 902 and memory array 904 (as depicted by arrow 850). Dashed lines 1130, 1132 and 1134 depict routing within one or more of metal layers M0 and M1 in the lateral direction (as depicted by arrow 850). The output of word line switch 976 is routed (after bonding pads 1114) in the lateral direction by the pathway of dashed line 1130 to connect to one word line in memory array 902 and one word line in memory array 904. The output of word line switch 978 is routed (after bonding pads 1114) in the lateral direction by the pathway of dashed line 1132 to connect to one word line in memory array 902 and one word line in memory array 904. The output of word line switch 980 is routed (after bonding pads 1114) in the lateral direction by the pathway of dashed line 1134 to connect to one word line in memory array 902 and one word line in memory array 904. Note that the bonding pads on memory die 201 of set of binding pads 1114 are depicted as being vertically displaced to make the drawing easier to read; however, in most implementations the bonding pads on memory die 201 are all at the same vertical position. Note that the only lateral routing of the output of the second subset of the word line switches is within one or more of metal layers M0/M1 (high metal layers).

A third subset of the word line switches (e.g., word line switches 970 and 972) are connected to a fifth set of word lines of memory array 902 without being connected to any word lines of memory array 904, as these word line switches are not shared between neighboring memory arrays. A fourth subset of the word line switches (e.g., word line switches 984 and 986) are connected to a sixth set of word lines of memory array 904 without being connected to any word lines memory array 902, as these word line switches are not shared between neighboring memory arrays. FIG. 10 labels the vertical connections from M0 to the word lines as CC. As described by FIG. 7, the control circuit 800 further includes one or more voltage sources connected to the word line switches so that word line switches serve to switchably provide voltages from one or more voltage sources to the word lines.

FIG. 10 shows a gap 906 between memory array 902 and memory array 904. The space/area withing gap 906 protrudes from between memory array 902 and memory array 904 down to the surface of control die 211 such that the first subset of the word line switches (e.g., shared word line switches 974 and 982) and the second subset of the word line switches (e.g., shared word line switches 976, 978 and 980) are positioned in the space protruding between the first non-volatile memory structure and the second non-volatile memory structure.

Figures 11A, 11B, 11C, 11D:
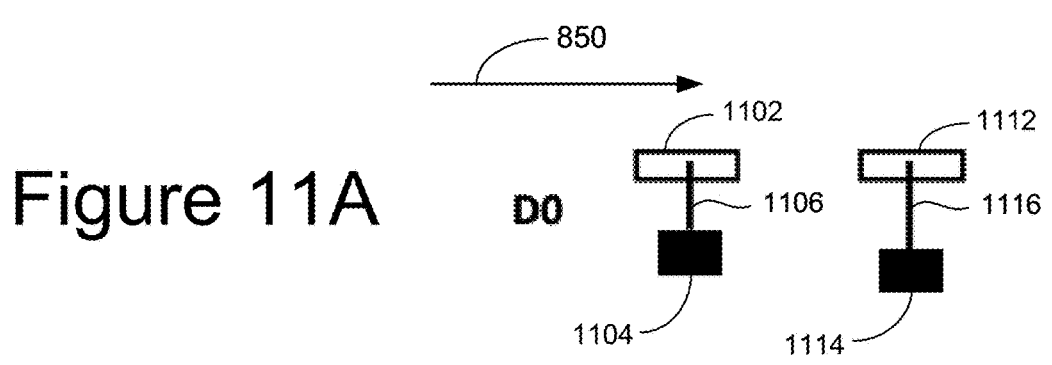
FIGS. 11A-D depict routing schemes in a plurality of metal layers for routing electrical signals.

FIGS. 11A-D depict routing schemes in a plurality of metal layers for high metal routing electrical signals. More specifically, FIGS. 11A-D provide examples of implementing high metal routing. FIG. 11A shows routing 1106 and 1116 in metal layer D0 from word line switches 1102 and 1112 to vias 1104 and 1114 (that vertically ascend to the bonding pads through D1/D2/D3/D4). Routing 1106 and 1116 in metal layer D0 is not in the lateral direction from between memory array 902 and memory array 904 toward one or more of memory array 902 and memory array 904 (as depicted by arrow 850). Rather, routing 1106 and 1116 in metal layer D0 are orthogonal to the lateral direction (orthogonal to arrow 850).

FIG. 11B shows an example of routing at metal layer M1. Electrical signals are received from bonding pads 1124 (see bonding pads 910) and routed by transmission paths 1122 in the lateral direction from between memory array 902 and memory array 904 toward one or more of memory array 902 and memory array 904 (as depicted by arrow 850). After routing in the lateral direction at M1, the electrical signals are provided to vias 1120 for transmission to metal layer M0. FIG. 11C provides a close-up view of one example of the connection to bonding pads 1124 at metal layer M1, including depicting cranks between the bonding pads.

FIG. 11D shows an example of routing at metal layer M1. Data is received at vias 1130 from metal layer M1 routed in different directions (including the lateral direction as per arrow 850 and a direction orthogonal to the lateral direction) by transmission pathways 1134 to vertical connections 1132 (CC).

Figure 12A:
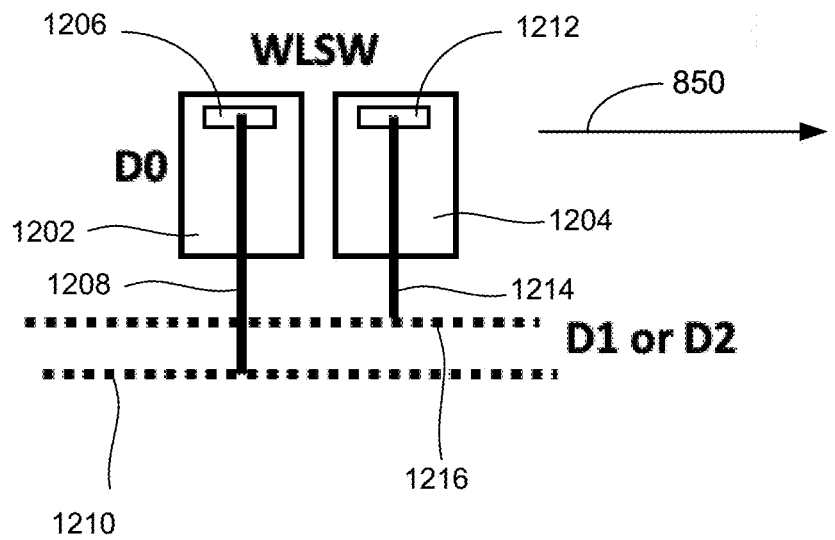

FIGS. 12A-F depict routing schemes in a plurality of metal layers for low metal routing of electrical signals. More specifically, FIGS. 12A-F provide examples of implementing low metal routing. FIG. 12A shows routing 1208 and 1214 in metal layer D0 from word line switches 1206 and 1212 to vias for connecting to signal paths 1210 and 1216 in either of metal layers D1 or D2. The signals paths in D1 or D2 provide routing in the lateral direction (as per arrow 850).

Figure 12C:
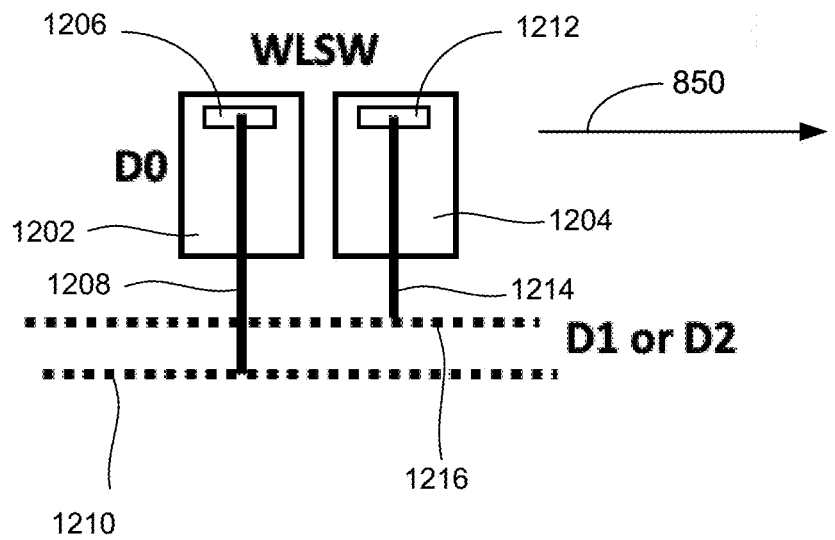
Figure 12B:
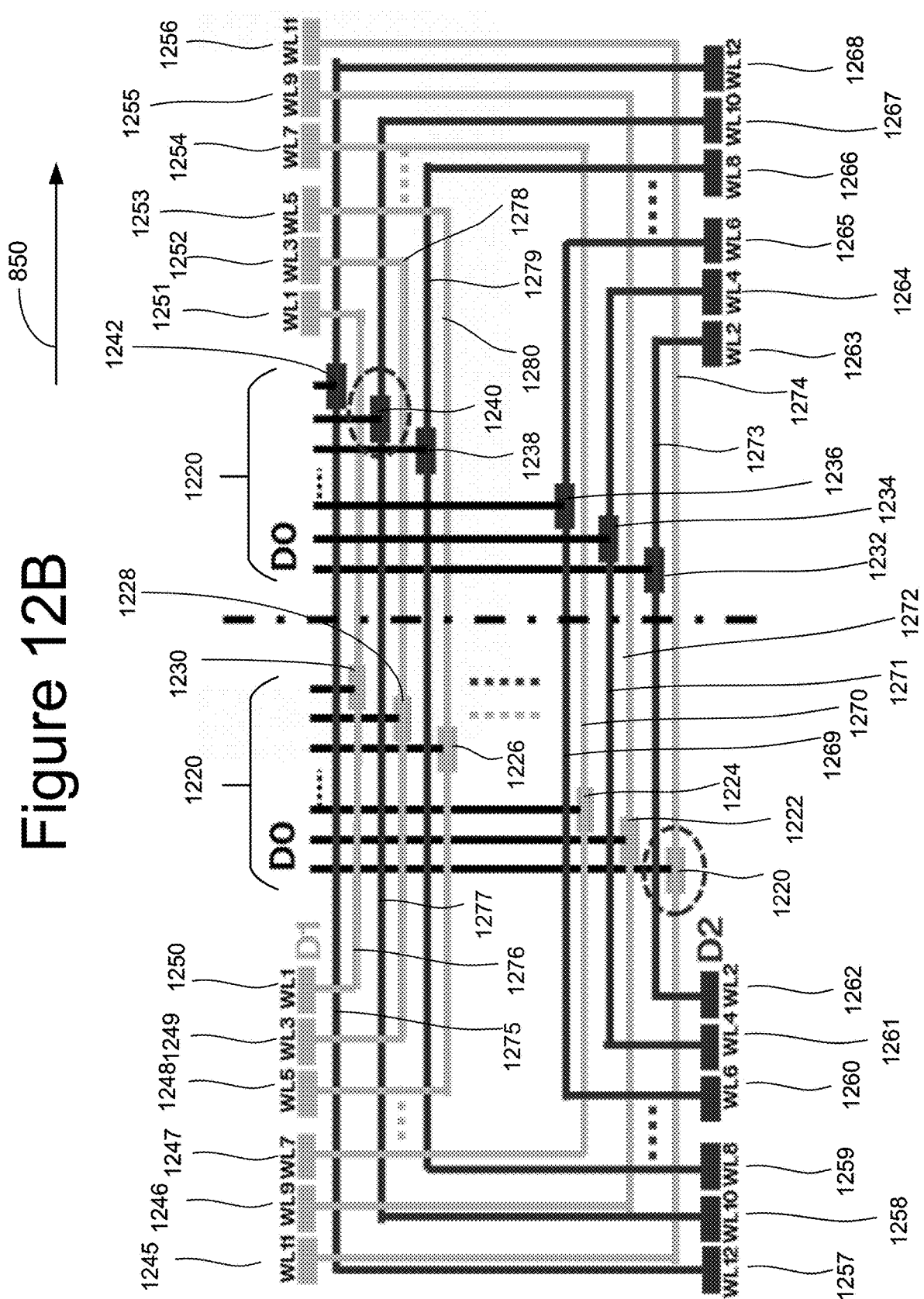

FIG. 12B shows an example of routing at metal layers D0/D1/D2. Transmission paths 1220 are at metal layer D0; are orthogonal to the lateral direction (orthogonal to arrow 850); connect to metal layer D1 at vias/connections 1220, 1222, 1224, 1226, 1228 and 1230; and connect to metal layer D2 at vias/connections 1232, 1234, 1236, 1238, 1240 and 1242.

Transmission path 1274 in metal layer D1 receives an output of a word line switch from D0 by way of via/connection 1220; routes the output in the lateral direction (as per arrow 850) to word line WL11 of memory array 902 by way of via 1245 to the bonding pads 1114 and to word line WL11 of memory array 904 by way of via 1256 to the bonding pads 1114. Transmission path 1273 in metal layer D1 receives an output of a word line switch from D0 by way of via/connection 1222; routes the output in the lateral direction (as per arrow 850) to word line WL9 of memory array 902 by way of via 1246 to the bonding pads 1114 and to word line WL9 of memory array 904 by way of via 1255 to the bonding pads 1114. Transmission path 1270 in metal layer D1 receives an output of a word line switch from D0 by way of via/connection 1224; routes the output in the lateral direction (as per arrow 850) to word line WL7 of memory array 902 by way of via 1247 to the bonding pads 1114 and to word line WL7 of memory array 904 by way of via 1254 to the bonding pads 1114. Transmission path 1280 in metal layer D1 receives an output of a word line switch from D0 by way of via/connection 1226; routes the output in the lateral direction (as per arrow 850) to word line WL5 of memory array 902 by way of via 1248 to the bonding pads 1114 and to word line WL5 of memory array 904 by way of via 1253 to the bonding pads 1114. Transmission path 1278 in metal layer D1 receives an output of a word line switch from D0 by way of via/connection 1228; routes the output in the lateral direction (as per arrow 850) to word line WL3 of memory array 902 by way of via 1249 to the bonding pads 1114 and to word line WL3 of memory array 904 by way of via 1252 to the bonding pads 1114. Transmission path 1276 in metal layer D1 receives an output of a word line switch from D0 by way of via/connection 1230; routes the output in the lateral direction (as per arrow 850) to word line WL1 of memory array 902 by way of via 1250 to the bonding pads 1114 and to word line WL1 of memory array 904 by way of via 1251 to the bonding pads 1114.

Transmission path 1273 in metal layer D2 receives an output of a word line switch from D0 by way of via/connection 1232; routes the output in the lateral direction (as per arrow 850) to word line WL2 of memory array 902 by way of via 1262 to the bonding pads 1114 and to word line WL2 of memory array 904 by way of via 1263 to the bonding pads 1114. Transmission path 1271 in metal layer D2 receives an output of a word line switch from D0 by way of via/connection 1234; routes the output in the lateral direction (as per arrow 850) to word line WL4 of memory array 902 by way of via 1261 to the bonding pads 1114 and to word line WL4 of memory array 904 by way of via 1264 to the bonding pads 1114. Transmission path 1269 in metal layer D2 receives an output of a word line switch from D0 by way of via/connection 1236; routes the output in the lateral direction (as per arrow 850) to word line WL6 of memory array 902 by way of via 1260 to the bonding pads 1114 and to word line WL6 of memory array 904 by way of via 1265 to the bonding pads 1114. Transmission path 1279 in metal layer D2 receives an output of a word line switch from D0 by way of via/connection 1238; routes the output in the lateral direction (as per arrow 850) to word line WL8 of memory array 902 by way of via 1259 to the bonding pads 1114 and to word line WL8 of memory array 904 by way of via 1266 to the bonding pads 1114. Transmission path 1277 in metal layer D2 receives an output of a word line switch from D0 by way of via/connection 1240; routes the output in the lateral direction (as per arrow 850) to word line WL10 of memory array 902 by way of via 1258 to the bonding pads 1114 and to word line WL10 of memory array 904 by way of via 1267 to the bonding pads 1114. Transmission path 1275 in metal layer D2 receives an output of a word line switch from D0 by way of via/connection 1242; routes the output in the lateral direction (as per arrow 850) to word line WL12 of memory array 902 by way of via 1257 to the bonding pads 1114 and to word line WL12 of memory array 904 by way of via 1268 to the bonding pads 1114.

FIG. 12C shows an example of routing at metal layer D4. Pads 1290 are connections to vias from metal layers D0/D1/D2/D3. Transmission paths 1291 are examples of routing orthogonal to the lateral direction (orthogonal to arrow 850) and connecting to bonding pads 1292.

FIG. 12D provides a close-up view of one example of the connection to pads 1293 (e.g., connections 1220, 1222, 1224, 1226, 1228 and/or 1230 to transmission paths 1294 at D0) by transmission paths 1295 at metal layer D1, including depicting cranks between the pads.

FIG. 12E provides a close-up view of one example of the connection to pads 1296 (e.g., connections 1232, 1234, 1236, 1238, 1249 and/or 1242 to transmission paths 1297 at D0) by transmission paths 1298 at metal layer D2, including depicting cranks between the pads.

FIG. 12F provides a close-up view of one example of routing around D2 pads 1299 (e.g., connections 1232, 1234, 1236, 1238, 1249 and/or 1242 to transmission paths 1300 at D0) by transmission paths 1301 at metal layer D1, including depicting cranks between the pads.

FIG. 13 is a flow chart describing one embodiment of a process for operating non-volatile memory. The process of FIG. 13 can be performed on the structures of FIGS. 7-12F or equivalents thereof during memory operations (e.g., erasing, programming/writing and reading). Step 1302 includes the memory system transmitting signals from a first subset of word line switches (e.g., a first subset of word line switches 922) to a first set of word lines of a first non-volatile memory array (e.g., 902) and a second set of word lines of a second non-volatile memory array (e.g., 904) adjacent to the first non-volatile memory array via routing within one or more low metal layers (e.g., D0/D1/D2/D3/D4) in a lateral direction (e.g., see arrow 850) from between the first non-volatile memory array and the second non-volatile memory array toward one or more of the first non-volatile memory array and the second non-volatile memory array. Step 1304 includes the memory system transmitting signals from a second subset of word line switches (e.g., a second subset of word line switches 922) in to a third set of word lines of the first non-volatile memory array (e.g., 902) and a fourth set of word lines of the second non-volatile memory array (e.g., 904) within one or more high metal layers (e.g., M0/M1) in the lateral direction (e.g., see arrow 850). The one or more low metal layers are positioned above the word line switches (see e.g., FIGS. 9 and 10). The one or more high metal layers are positioned above the one or more low metal layers (see e.g., M0/M1 positioned above D0/D1/D2/D3/D4 in FIG. 9). The one or more high metal layers are positioned below the first non-volatile memory structure and the second non-volatile memory structure (see e.g., M0/M1 below arrays 902 and 904 in FIG. 9). Step 1306 includes the memory system transmitting signals from a third subset of word line switches (e.g., word line switches 920) to a fifth set of word lines of the first non-volatile memory array (e.g., 902) without transmitting signals from the third subset of word line switches to word lines of the second non-volatile memory array. That is, for example, word line switches 920 do not transmit signals to the word lines of non-volatile memory array 904. Step 1308 includes the memory system transmitting signals from a fourth subset of word line switches (e.g., word line switches 924) to a sixth set of word lines of the second non-volatile memory array (e.g., 904) without transmitting signals from the fourth subset of word line switches to word lines of the first non-volatile memory array. That is, for example, word line switches 924 do not transmit signals to the word lines of non-volatile memory array 902.

Step 1310 of FIG. 13 includes the memory system programming data into memory cells of the first non-volatile memory array that are connected to the first set of word lines in response to the transmitting signals from the first subset of word line switches to the first set of word lines of the first non-volatile memory array and the second set of word lines of the second non-volatile memory array adjacent to the first non-volatile memory array. For example, programming is performed including transmitting Vpgm to the selected word line (see e.g., step 608 of FIG. 6) and boosting voltages to the unselected word lines (see e.g., step 606 of FIG. 6). Step 1312 includes the memory system programming data into memory cells of the second non-volatile memory array that are connected to the second set of word lines in response to the transmitting signals from the first subset of word line switches to the first set of word lines of the first non-volatile memory array and the second set of word lines of the second non-volatile memory array adjacent to the first non-volatile memory array.

Step 1314 of FIG. 13 includes the memory system reading data stored in memory cells of the first non-volatile memory array that are connected to the first set of word lines in response to the transmitting signals from the first subset of word line switches to the first set of word lines of the first non-volatile memory array and the second set of word lines of the second non-volatile memory array adjacent to the first non-volatile memory array. For example, reading is performed including transmitting a read reference voltage to the selected word line (see e.g., FIG. 5C) and overdrive voltages to the unselected word lines. Step 1316 includes the memory system reading data stored in memory cells of the second non-volatile memory array that are connected to the second set of word lines in response to the transmitting signals from the first subset of word line switches to the first set of word lines of the first non-volatile memory array and the second set of word lines of the second non-volatile memory array adjacent to the first non-volatile memory array.

A non-volatile memory system has been described that saves space on the die by sharing word line switches between neighboring memory arrays. A routing scheme has been proposed that enables an efficient implementation sharing the word line switches.

One embodiment includes a non-volatile storage apparatus, comprising: a first non-volatile memory structure comprising a first plurality of non-volatile memory cells and word lines connected to the first plurality of non-volatile memory cells; a second non-volatile memory structure comprising a second plurality of non-volatile memory cells and word lines connected to the second plurality of non-volatile memory cells; a control circuit connected to the first non-volatile memory structure and the second non-volatile memory structure, the control circuit comprises word line switches; and a plurality of metal layers for routing electrical signals, the plurality of metal layers comprises one or more low metal layers and one or more high metal layers, the one or more low metal layers are positioned above the word line switches, the one or more high metal layers are positioned above the one or more low metal layers, the one or more high metal layers are positioned below the first non-volatile memory structure and the second non-volatile memory structure, a first subset of the word line switches are connected to a first set of word lines of the first non-volatile memory structure and a second set of word lines of the second non-volatile memory structure via routing within one or more of the low metal layers in a lateral direction from between the first non-volatile memory structure and the second non-volatile memory structure toward one or more of the first non-volatile memory structure and the second non-volatile memory structure, a second subset of the word line switches are connected to a third set of word lines of the first non-volatile memory structure and a fourth set of word lines of the second non-volatile memory structure via routing within one or more of the high metal layers in the lateral direction.

In one example implementation, a third subset of the word line switches are connected to a fifth set of word lines of the first non-volatile memory structure without being connected to any word lines of the second non-volatile memory structure; and a fourth subset of the word line switches are connected to a sixth set of word lines of the second non-volatile memory structure without being connected to any word lines of the first non-volatile memory structure.

In one example implementation, the first subset of the word line switches are connected to the first set of word lines of the first non-volatile memory structure and the second set of word lines of the second non-volatile memory structure via routing in the lateral direction only within one or more of the low metal layers; and the second subset of the word line switches are connected to the third set of word lines of the first non-volatile memory structure and the fourth set of word lines of the second non-volatile memory structure via routing in the later direction only within one or more of the high metal layers.

In one example implementation, the first non-volatile memory structure and the second non-volatile memory structure are separate non-volatile memory arrays.

In one example implementation, the first non-volatile memory structure and the second non-volatile memory structure are separate non-volatile memory arrays with separate word lines.

In one example implementation, the first non-volatile memory structure is adjacent to the second non-volatile memory structure.

In one example implementation, the first non-volatile memory structure is adjacent to the second non-volatile memory structure with a space protruding between the first non-volatile memory structure and the second non-volatile memory structure; and the first subset of the word line switches and the second subset of the word line switches are positioned in the space protruding between the first non-volatile memory structure and the second non-volatile memory structure.

In one example implementation, the first subset of the word line switches and the second subset of the word line switches are positioned in a space between the first non-volatile memory structure and the second non-volatile memory structure.

In one example implementation, the control circuit includes one or more voltage sources connected to the word line switches.

One example implementation further comprises a first semiconductor die and a second semiconductor die attached to the first semiconductor die. The first non-volatile memory structure and the second non-volatile memory structure are positioned on the first semiconductor die. The control circuit is positioned on the second semiconductor die. The one or more low metal layers are positioned on the second semiconductor die. The one or more high metal layers are positioned on the first semiconductor die. The second semiconductor die is bonded to the first semiconductor die between the one or more low metal layers and the one or more high metal layers. The first non-volatile memory structure and the second non-volatile memory structure have ends facing each other in a shape of a staircase, the ends facing each other connect to the one or more high metal layers. The first non-volatile memory structure and the second non-volatile memory structure are separate non-volatile memory arrays. The first non-volatile memory structure is adjacent to the second non-volatile memory structure. The first subset of the word line switches and the second subset of the word line switches are positioned in a space between the first non-volatile memory structure and the second non-volatile memory structure.

One embodiment includes a non-volatile storage apparatus, comprising a first semiconductor die and a second semiconductor die. The first semiconductor die comprises a first non-volatile memory array and a second non-volatile memory array adjacent to the first non-volatile memory array. The first non-volatile memory array comprises a first plurality of non-volatile memory cells and word lines connected to the first plurality of non-volatile memory cells. The second non-volatile memory array comprises a second plurality of non-volatile memory cells and word lines connected to the second plurality of non-volatile memory cells. The first semiconductor die further comprises a first plurality of pathways connected to the first non-volatile memory array and the second non-volatile memory array. The second semiconductor die is attached to the first semiconductor die and comprises a control circuit and a second plurality of pathways. The first plurality of pathways are in communication with the second plurality of pathways. The control circuit is configured to transfer signals to the first plurality of non-volatile memory cells and the second plurality of non-volatile memory cells via the first plurality of pathways and the second plurality of pathways. The control circuit comprises one or more voltage sources and word line switches connected to the one or more voltage sources. A first subset of the word line switches are connected to a first set of word lines of the first non-volatile memory array and a second set of word lines of the second non-volatile memory array via routing within one or more of the second plurality of pathways in a direction from between the first non-volatile memory array and the second non-volatile memory array toward one or more of the first non-volatile memory array and the second non-volatile memory array. A second subset of the word line switches are connected to a third set of word lines of the first non-volatile memory cell array and a fourth set of word lines of the second non-volatile memory cell array via routing within one or more of the second plurality of pathways in a direction from between the first non-volatile memory array and the second non-volatile memory array toward one or more of the first non-volatile memory array and the second non-volatile memory array.

In one example implementation, the second semiconductor die further comprises an interface to a memory controller that is physically separate from the first semiconductor die and the second semiconductor die; the second semiconductor die is bonded to the first semiconductor die via bonding pads; the first plurality of pathways are metal interconnect layers on the first semiconductor die positioned above the bonding pads; and the second plurality of pathways are metal interconnect layers on the second semiconductor die positioned below the bonding pads.

In one example implementation, the first subset of the word line switches and the second subset of the word line switches are positioned in a space between the first non-volatile memory array and the second non-volatile memory array.

One embodiment includes a method, comprising: transmitting signals from a first subset of word line switches to a first set of word lines of a first non-volatile memory array and a second set of word lines of a second non-volatile memory array adjacent to the first non-volatile memory array via routing within one or more low metal layers in a lateral direction from between the first non-volatile memory array and the second non-volatile memory array toward one or more of the first non-volatile memory array and the second non-volatile memory array; transmitting signals from a second subset of word line switches to a third set of word lines of the first non-volatile memory array and a fourth set of word lines of the second non-volatile memory array within one or more high metal layers in the lateral direction, the one or more low metal layers are positioned above the word line switches, the one or more high metal layers are positioned above the one or more low metal layers, the one or more high metal layers are positioned below the first non-volatile memory structure and the second non-volatile memory structure; transmitting signals from a third subset of word line switches to a fifth set of word lines of the first non-volatile memory array without transmitting signals from the third subset of word line switches to word lines of the second non-volatile memory array; and transmitting signals from a fourth subset of word line switches to a sixth set of word lines of the second non-volatile memory array without transmitting signals from the fourth subset of word line switches to word lines of the first non-volatile memory array.

One example implementation further comprises programming data into memory cells of the first non-volatile memory array that are connected to the first set of word lines in response to the transmitting signals from the first subset of word line switches to the first set of word lines of the first non-volatile memory array and the second set of word lines of the second non-volatile memory array.

One example implementation further comprises programming data into memory cells of the second non-volatile memory array that are connected to the second set of word lines in response to the transmitting signals from the first subset of word line switches to the first set of word lines of the first non-volatile memory array and the second set of word lines of the second non-volatile memory array.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a first non-volatile memory structure comprising a first plurality of non-volatile memory cells and word lines connected to the first plurality of non-volatile memory cells;
a second non-volatile memory structure comprising a second plurality of non-volatile memory cells and word lines connected to the second plurality of non-volatile memory cells;
a control circuit connected to the first non-volatile memory structure and the second non-volatile memory structure, the control circuit comprises word line switches; and
a plurality of metal layers for routing electrical signals, the plurality of metal layers comprises one or more low metal layers and one or more high metal layers, the one or more low metal layers are positioned above the word line switches, the one or more high metal layers are positioned above the one or more low metal layers, the one or more high metal layers are positioned below the first non-volatile memory structure and the second non-volatile memory structure, a first subset of the word line switches are connected to a first set of word lines of the first non-volatile memory structure and a second set of word lines of the second non-volatile memory structure via routing within one or more of the low metal layers in a lateral direction from between the first non-volatile memory structure and the second non-volatile memory structure toward one or more of the first non-volatile memory structure and the second non-volatile memory structure, a second subset of the word line switches are connected to a third set of word lines of the first non-volatile memory structure and a fourth set of word lines of the second non-volatile memory structure via routing within one or more of the high metal layers in the lateral direction.

2. The non-volatile storage apparatus of claim 1, wherein:
a third subset of the word line switches are connected to a fifth set of word lines of the first non-volatile memory structure without being connected to any word lines of the second non-volatile memory structure; and
a fourth subset of the word line switches are connected to a sixth set of word lines of the second non-volatile memory structure without being connected to any word lines of the first non-volatile memory structure.

3. The non-volatile storage apparatus of claim 1, wherein:
the first subset of the word line switches are connected to the first set of word lines of the first non-volatile memory structure and the second set of word lines of the second non-volatile memory structure via routing in the lateral direction only within one or more of the low metal layers; and
the second subset of the word line switches are connected to the third set of word lines of the first non-volatile memory structure and the fourth set of word lines of the second non-volatile memory structure via routing in the lateral direction only within one or more of the high metal layers.

4. The non-volatile storage apparatus of claim 1, wherein:
the first non-volatile memory structure and the second non-volatile memory structure are separate non-volatile memory arrays.

5. The non-volatile storage apparatus of claim 1, wherein:
the first non-volatile memory structure and the second non-volatile memory structure are separate non-volatile memory arrays with separate word lines.

6. The non-volatile storage apparatus of claim 1, wherein:
the first non-volatile memory structure is adjacent to the second non-volatile memory structure.

7. The non-volatile storage apparatus of claim 1, wherein:
the first non-volatile memory structure is adjacent to the second non-volatile memory structure with a space protruding between the first non-volatile memory structure and the second non-volatile memory structure; and
the first subset of the word line switches and the second subset of the word line switches are positioned in the space protruding between the first non-volatile memory structure and the second non-volatile memory structure.

8. The non-volatile storage apparatus of claim 1, wherein:
the first subset of the word line switches and the second subset of the word line switches are positioned in a space between the first non-volatile memory structure and the second non-volatile memory structure.

9. The non-volatile storage apparatus of claim 1, wherein:
the control circuit includes one or more voltage sources connected to the word line switches.

10. The non-volatile storage apparatus of claim 1, further comprising:
a first semiconductor die, the first non-volatile memory structure and the second non-volatile memory structure are positioned on the first semiconductor die; and
a second semiconductor die attached to the first semiconductor die, the control circuit is positioned on the second semiconductor die.

11. The non-volatile storage apparatus of claim 10, wherein:
the one or more low metal layers are positioned on the second semiconductor die; and
the one or more high metal layers are positioned on the first semiconductor die.

12. The non-volatile storage apparatus of claim 11, wherein:
the second semiconductor die is bonded to the first semiconductor die between the one or more low metal layers and the one or more high metal layers.

13. The non-volatile storage apparatus of claim 12, wherein:
the first non-volatile memory structure and the second non-volatile memory structure have ends facing each other in a shape of a staircase, the ends facing each other connect to the one or more high metal layers.

14. The non-volatile storage apparatus of claim 11, wherein:
the first non-volatile memory structure and the second non-volatile memory structure are separate non-volatile memory arrays;
the first non-volatile memory structure is adjacent to the second non-volatile memory structure; and
the first subset of the word line switches and the second subset of the word line switches are positioned in a space between the first non-volatile memory structure and the second non-volatile memory structure.

15. A non-volatile storage apparatus, comprising:
a first semiconductor die comprising a first non-volatile memory array and a second non-volatile memory array adjacent to the first non-volatile memory array, the first non-volatile memory array comprises a first plurality of non-volatile memory cells and word lines connected to the first plurality of non-volatile memory cells, the second non-volatile memory array comprises a second plurality of non-volatile memory cells and word lines connected to the second plurality of non-volatile memory cells, the first semiconductor die further comprises a first plurality of pathways connected to the first non-volatile memory array and the second non-volatile memory array; and
a second semiconductor die attached to the first semiconductor die, the second semiconductor die comprising a control circuit and a second plurality of pathways, the first plurality of pathways are in communication with the second plurality of pathways, the control circuit is configured to transfer signals to the first plurality of non-volatile memory cells and the second plurality of non-volatile memory cells via the first plurality of pathways and the second plurality of pathways, the control circuit comprises:
one or more voltage sources; and
word line switches connected to the one or more voltage sources, a first subset of the word line switches are connected to a first set of word lines of the first non-volatile memory array and a second set of word lines of the second non-volatile memory array via routing within one or more of the second plurality of pathways in a direction from between the first non-volatile memory array and the second non-volatile memory array toward one or more of the first non-volatile memory array and the second non-volatile memory array, a second subset of the word line switches are connected to a third set of word lines of the first non-volatile memory cell array and a fourth set of word lines of the second non-volatile memory cell array via routing within one or more of the second plurality of pathways in a direction from between the first non-volatile memory array and the second non-volatile memory array toward one or more of the first non-volatile memory array and the second non-volatile memory array.

16. The non-volatile storage apparatus of claim 15, wherein:
the second semiconductor die further comprises an interface to a memory controller that is physically separate from the first semiconductor die and the second semiconductor die;
the second semiconductor die is bonded to the first semiconductor die via bonding pads;
the first plurality of pathways are metal interconnect layers on the first semiconductor die positioned above the bonding pads; and
the second plurality of pathways are metal interconnect layers on the second semiconductor die positioned below the bonding pads.

17. The non-volatile storage apparatus of claim 16, wherein:
the first subset of the word line switches and the second subset of the word line switches are positioned in a space between the first non-volatile memory array and the second non-volatile memory array.

18. A method, comprising:
transmitting signals from a first subset of word line switches to a first set of word lines of a first non-volatile memory array and a second set of word lines of a second non-volatile memory array adjacent to the first non-volatile memory array via routing within one or more low metal layers in a lateral direction from between the first non-volatile memory array and the second non-volatile memory array toward one or more of the first non-volatile memory array and the second non-volatile memory array;

transmitting signals from a second subset of word line switches to a third set of word lines of the first non-volatile memory array and a fourth set of word lines of the second non-volatile memory array within one or more high metal layers in the lateral direction, the one or more low metal layers are positioned above the word line switches, the one or more high metal layers are positioned above the one or more low metal layers, the one or more high metal layers are positioned below the first non-volatile memory structure and the second non-volatile memory structure;

transmitting signals from a third subset of word line switches to a fifth set of word lines of the first non-volatile memory array without transmitting signals from the third subset of word line switches to word lines of the second non-volatile memory array; and transmitting signals from a fourth subset of word line switches to a sixth set of word lines of the second non-volatile memory array without transmitting signals from the fourth subset of word line switches to word lines of the first non-volatile memory array.

19. The method of claim 18, further comprising:

programming data into memory cells of the first non-volatile memory array that are connected to the first set of word lines in response to the transmitting signals from the first subset of word line switches to the first set of word lines of the first non-volatile memory array and the second set of word lines of the second non-volatile memory array.

20. The method of claim 18, further comprising:

programming data into memory cells of the second non-volatile memory array that are connected to the second set of word lines in response to the transmitting signals from the first subset of word line switches to the first set of word lines of the first non-volatile memory array and the second set of word lines of the second non-volatile memory array.

* * * * *